United States Patent [19]
Yasue et al.

[11] Patent Number: 6,010,768
[45] Date of Patent: Jan. 4, 2000

[54] MULTILAYER PRINTED CIRCUIT BOARD, METHOD OF PRODUCING MULTILAYER PRINTED CIRCUIT BOARD AND RESIN FILLER

[75] Inventors: Toshihiko Yasue; Yasuji Hiramatsu; Hideki Yano; Yoshifumi Ishitani; Yoichiro Kawamura; Hideki Murase; Ayumi Suzuki; Masato Kawade; Motoo Asai, all of Gifu, Japan

[73] Assignee: Ibiden Co., Ltd., Gifu, Japan

[21] Appl. No.: 08/854,683

[22] Filed: May 12, 1997

Related U.S. Application Data

[63] Continuation-in-part of application No. 08/737,321, Nov. 12, 1996, abandoned.

[30] Foreign Application Priority Data

Nov. 10, 1995 [JP] Japan ..................................... 7-317469

[51] Int. Cl.$^7$ ..................................................... B32B 3/00
[52] U.S. Cl. ........................... 428/209; 174/255; 174/258; 428/901
[58] Field of Search ................................... 428/901, 209; 174/255, 258

[56] References Cited

U.S. PATENT DOCUMENTS

| | | | |
|---|---|---|---|
| 4,574,371 | 3/1986 | Takemura et al. | 369/100 |
| 4,752,499 | 6/1988 | Enomoto | 427/98 |
| 4,927,983 | 5/1990 | Jones et al. | 174/258 |
| 5,021,472 | 6/1991 | Enomoto | 523/427 |
| 5,055,321 | 10/1991 | Enomoto et al. | 427/98 |
| 5,227,012 | 7/1993 | Brandli et al. | 428/901 |
| 5,344,893 | 9/1994 | Asai et al. | 525/398 |
| 5,447,996 | 9/1995 | Asai et al. | 525/398 |
| 5,519,177 | 5/1996 | Wang et al. | 174/259 |
| 5,589,255 | 12/1996 | Enomoto et al. | 428/261 |
| 5,688,583 | 11/1997 | Asai et al. | 428/206 |
| 5,741,575 | 4/1998 | Asai et al. | 428/210 |

FOREIGN PATENT DOCUMENTS

| | | |
|---|---|---|
| 51-22065 | 2/1976 | Japan . |
| 58-147097 | 9/1983 | Japan . |
| 60-62193 | 4/1985 | Japan . |
| 2188992 | 7/1990 | Japan . |
| 5-7080 | 1/1993 | Japan . |
| 5-67881 | 3/1993 | Japan . |
| 5299837 | 11/1993 | Japan . |
| 7-30259 | 1/1995 | Japan . |
| 9717824 | 5/1997 | WIPO . |

OTHER PUBLICATIONS

English Language Abstract of JP 05–67881.
English Language Abstract of JP 05–7080.
English Language Abstract of JP 07–30259.
English Language Abstract of JP 05–299837.
English Language Abstract of JP 02–188992.
English Language Abstract of JP 51–22065.
English Language Abstract of JP 60–62193.
English Language Abstract of JP 58–147097.
International Search Reports (English and Japanese language versions).

*Primary Examiner*—Deborah Jones
*Assistant Examiner*—Cathy F. Lam
*Attorney, Agent, or Firm*—Greenblum & Bernstein, P.L.C.

[57] ABSTRACT

It is to provide a multilayer printed circuit board having excellent resolution, interlaminar insulation property and resistance to cool-heat shock without forming unevenness on the surface and lowering peel strength even if the thickness of the resin insulating layer is thin. The invention proposes a multilayer printed circuit board comprising an upper conductor circuit layer, a lower conductor circuit layer and a resin insulating layer electrically insulating both the conductor circuit layers, in which the resin insulating layer is a composite layer comprised of an layer made from a heat-resistant resin hardly soluble in acid or oxidizing agent as a lower layer and an adhesive layer for electroless plating made from a heat-resistant resin as an upper layer, and if necessary, a resin is filled in a concave portion created between conductor insulating circuits of the lower layer so as to render the surface into the same plane as the surface of the conductor circuit.

15 Claims, 7 Drawing Sheets

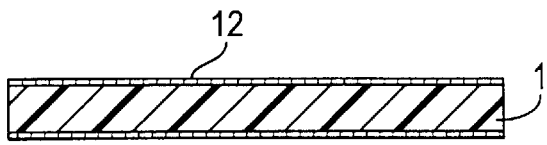
FIG. 3A
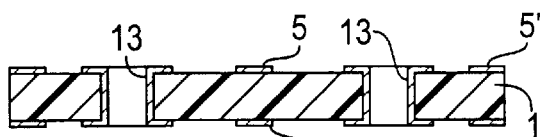
FIG. 3B
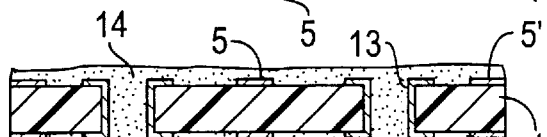
FIG. 3C
FIG. 3D
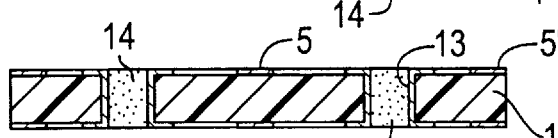
FIG. 3E
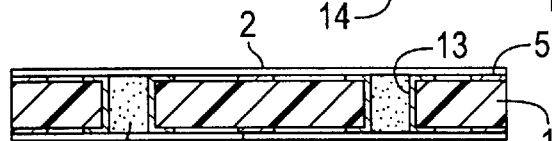
FIG. 3F
FIG. 3G
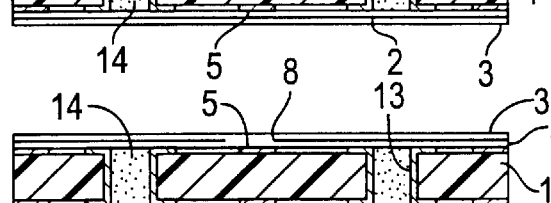
FIG. 3H
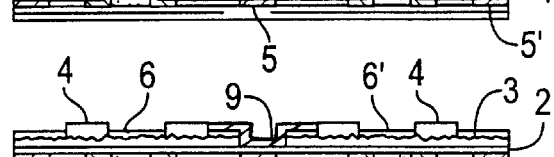
FIG. 3I
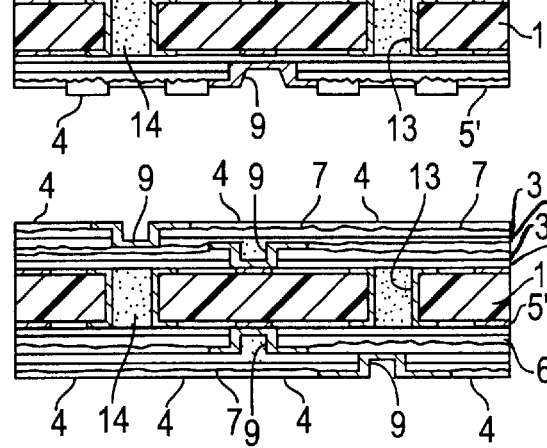

MULTILAYER PRINTED CIRCUIT BOARD, METHOD OF PRODUCING MULTILAYER PRINTED CIRCUIT BOARD AND RESIN FILLER

This application is a continuation-in-part of the U.S. Application Ser. No. 08/737,321 filed Nov. 12, 1996, now abandoned.

TECHNICAL FIELD

This invention relates to a multilayer printed circuit board, a method of producing a multilayer printed circuit board and a resin filler, and more particularly it proposes structures of a resin insulating layer suitable for the provision of a multilayer printed circuit board having an improved interlaminar insulation property and a resin filler as well as a method of producing the same.

BACKGROUND ART

As the multilayer printed circuit board, there is a build-up multilayer printed circuit board in which a conductor circuit and a resin insulating layer are alternately built-up and an inner circuit layer and an outer circuit layer are electrically connected to each other through viaholes or the like. This build-up multilayer printed circuit board is generally manufactured by a method wherein a layer of the conductor circuit is formed in a position closest to a substrate by a subtractive process and then a plurality of conductor circuit layers are laminated on the conductor circuit layer by an additive process.

The subtractive process is a method of forming the conductor circuit by subjecting a surface of a copper lined laminate to an etching treatment and can cheaply form the conductor circuit layer having a high reliability.

The additive process is a method wherein an adhesive for electroless plating is applied onto a substrate such as glass epoxy or the like to form a resin insulating layer and then the resin insulating layer is roughened and a plating resist is formed on the roughened surface and then a metal for conductor circuit is applied thereto by electroless plating. According to this method, the conductor circuit is formed on the roughened resin insulating layer through the plating or the like, so that the excellent adhesion property therebetween can be ensured and hence there can be manufactured a printed circuit board in which the conductor circuit hardly peels from the resin insulating layer.

In the multilayer printed circuit board, when the innermost conductor circuit is formed by the subtractive process, concave portion is caused between the conductor circuits formed by the etching treatment. Therefore, when the resin insulating layer is formed on the wiring substrate having the concave portion between the conductor circuits, as shown in FIG. 4(a), the surface of the resin insulating layer becomes uneven and hence there is caused a problem that the viahole shape formed in the resin insulating layer and junction pad are deformed to cause poor mounting.

Concretely, the resin insulating layer formed in a large area portion of the conductor circuit becomes thicker as compared with the resin insulating layer formed in a small area portion of the conductor circuit. As a result, the exposure and development conditions of the viahole vary in accordance with the thickness of the resin insulating layer, so that ①. When the exposure and development conditions are matched with the thin portion of the resin insulating layer, a developing residue is created in the viahole formed in the thick portion of the resin insulating layer to close the opening of the viahole and hence the connection to a wiring layer arranged on the upper layer becomes incomplete (see FIG. 4(b)).

②. When the exposure and development conditions are matched with the thick portion of the resin insulating layer, the insulating material is peeled from the vicinity of the viahole formed in the thin portion of the resin insulating layer, which results in the poor insulation (see FIG. 4(c)).

On the other hand, the resin insulating layer being inevitable in the above additive process is generally formed by simply applying one kind of the resin composition. However, as the printed circuit board is recently used in various fields, it is very difficult to form the resin insulating layer so as to exhibit excellent application adaptability in all fields. Lately, the resin insulating layer constituting the printed circuit board tends to become thinner in accordance with the high performance and high densification of electric parts, which is difficult to ensure the insulating property between the conductor layer and another conductor layer and hence results in the lowering of reliability in the multilayer printed circuit board.

Furthermore, the surface of the resin insulating layer is roughened by using an acid or an oxidizing agent and dissolving and removing particles of heat-resistant resin soluble in the oxidizing agent or the like, which are dispersed in heat-resistant resin hardly soluble in the oxidizing agent or the like. However, if aggregation or the like is caused in the heat-resistant resin particles to be dissolved and removed, the depth of the roughened layer is not constant. Particularly, when the resin insulating layer is thin, the depth of the roughened layer may arrive at the thickness of the resin insulating layer and hence the interlaminar insulation property naturally required in the resin insulating layer considerably lowers.

It is a main object of the invention to provide a new structure of a resin insulating layer capable of providing a multilayer printed circuit board having an excellent interlaminar insulation property without lowering the peel strength even if the thickness of the resin insulating layer is thin.

It is another object of the invention to provide a multilayer printed circuit board having an excellent resolution capable of conducting exposure and development treatments under same conditions without forming unevenness on the surface even if an innermost layer of conductor circuits is formed by an etching treatment through the subtractive process as well as a method of producing the same.

It is the other object of the invention to provide a multilayer printed circuit board having excellent resolution, interlaminar insulation property and resistance to cool and heat shocks.

It is a still further object to provide a resin filler for smoothening the surface of the substrate suitable for the multilayer printed circuit board.

SUMMARY OF THE INVENTION

The inventors have made various studies in order to achieve the above objects. As a result, the inventors have found that it is effective to achieve the above main object when the resin insulating layer is constructed with a composite film comprising at least two layers of an adhesive layer for electroless plating contributing to improve an adhesion strength to conductor and an insulating layer contributing to improve an interlaminar insulation property.

Furthermore, the inventors have found that it is effective to achieve the above another object when a resin smoothening a surface of a substrate is filled between conductor circuits formed by the subtractive process and subjected to a polishing, if necessary.

The invention is based on this knowledge and constructed as follows:

(1) A multilayer printed circuit board comprising an upper conductor circuit layer, a lower conductor circuit layer and a resin insulating layer electrically insulating both the conductor circuit layers, characterized in that said resin insulating layer is comprised of a composite layer consisting of an insulating layer made from a heat-resistant resin hardly soluble in acid or an oxidizing agent as a lower layer and an adhesive layer for electroless plating made from a heat-resistant resin as an upper layer.

(2) In the invention described in the item (1), the insulating layer is preferable to contain a thermoplastic resin.

(3) In the invention described in the item (1), the insulating layer is preferable to be a heat-resistant resin containing an organic resin filler hardly soluble in the acid or oxidizing agent.

(4) In the invention described in the item (1), the adhesive layer is preferable to be an adhesive formed by dispersing cured particles of a heat-resistant resin soluble in the acid or oxidizing agent into a matrix of a heat-resistant resin hardly soluble in the acid or oxidizing agent.

(5) In the invention described in the item (1), it is preferable that the adhesive layer has a thickness of 10–50 μm and the insulating layer has a thickness of 10–100 μm.

(6) In the invention described in the item (3), it is favorable that the organic resin filler is particles of a heat-resistant resin hardly soluble in the acid or oxidizing agent and has a maximum particle size corresponding to not more than 8/10 of the thickness of the insulating layer and an average particle size corresponding to not more than ½ of the thickness of the insulating layer.

(7) In the invention described in the item (3), it is favorable that a filling amount of the organic resin filler is 10–100 parts by volume per 100 parts by volume of the heat-resistant resin.

(8) In the invention described in the item (3), it is favorable that the organic resin filler is made from at least one resin selected from the group consisting of epoxy resin, benzoguanamine resin, styreae resin, divinylbenzene resin and polyimide resin.

(9) It is desirable that cured particles of a heat-resistant resin soluble in the acid or oxidizing agent and having an average particle size of 0.1–2.0 μm are dispersed into the insulating layer as the lower layer.

(10) A multilayer printed circuit board comprising an upper conductor circuit layer, a lower conductor circuit layer and a resin insulating layer electrically insulating both the conductor circuit layers, characterized in that said lower conductor circuit layer is formed by etching a substrate provided with a conductor layer to remove a conductor useless portion therefrom, and a resin is filled in a concave portion formed by removing the conductor useless portion so that the surface of the resin is same as the surface of the lower conductor circuit layer.

(11) In the invention described in the item (10), it is preferable that the resin filled in the concave portion formed by removing the conductor useless portion is a cured product of non-solvent resin.

(12) In the invention described in the item (10), it is preferable that the resin filled in the concave portion formed by removing the conductor useless portion contains inorganic particles.

(13) A multilayer printed circuit board comprising an upper conductor circuit layer, a lower conductor circuit layer and a resin insulating layer electrically insulating both the conductor circuit layers, characterized in that said lower conductor circuit layer is formed by etching a substrate provided with a conductor layer to remove a conductor useless portion therefrom, and a resin is filled in a concave portion formed by removing the conductor useless portion so that the surface of the resin is saue as the surface of the lower conductor circuit layer, and said resin insulating layer is comprised of a composite layer consisting of an insulating layer made from a heat-resistant resin hardly soluble in acid or an oxidizing agent as a lower layer and an adhesive layer for electroless plating made from a heat-resistant resin as an upper layer, and said upper conductor circuit layer is formed on said adhesive layer constituting the upper layer of said resin insulating layer.

(14) In the invention described in the item (13), it is preferable that the resin filled in the concave portion formed by removing the conductor useless portion is a cured product of non-solvent resin.

(15) In the invention described in the item (13), it is preferable that the resin filled in the concave portion formed by removing the conductor useless portion contains inorganic particles.

(16) It is desirable that cured particles of a heat-resistant resin soluble in the acid or oxidizing agent and having an average particle size of 0.1–2.0 μm are dispersed in the insulating layer of the item (13).

(17) A method of producing a multilayer printed circuit board comprising an upper conductor circuit layer, a lower conductor circuit layer and a resin insulating layer electrically insulating both the conductor circuit layers, which comprises the following steps (a)–(e):
(a) a step of forming said lower conductor circuit layer by etching a substrate provided with a conductor layer to remove a conductor useless portion therefrom;
(b) a step of applying a resin to the substrate having a concave portion formed by removing the conductor useless portion and then curing the resin;
(c) a step of polishing the cured resin of the step (b) till the lower conductor circuit layer is exposed;
(d) a step of forming said resin insulating layer;
(e) a step of forming said upper conductor circuit layer on said resin insulating layer.

(18) In the invention described in the item (17), it is preferable that said resin insulating layer formed in the step (d) is a composite layer consisting of an insulating layer made from a heat-resistant resin hardly soluble in acid or an oxidizing agent as a lower layer and an adhesive layer for electroless plating made from a heat-resistant resin as an upper layer.

(19) It is desirable that cured particles of a heat-resistant resin soluble in the acid or oxidizing agent and having an average particle size of 0.1–2.0 μm are dispersed in the insulating layer of the item (18).

(20) A resin filler of non-solvent filled in a concave portion created on a surface of a wiring substrate or in a through-hole formed in the substrate, in which bisphenol type epoxy resin is used as a resin component and an imidazole curing agent is a curing agent.

(21) A resin filler of non-solvent filled in a concave portion created on a surface of a wiring substrate or in a through-hole formed in the substrate, in which bisphenol type epoxy resin is used as a resin component and an imidazole curing agent is a curing agent and inorganic particles are used as an additive component.

(22) In the resin filler described in the item (20) or (21), it is preferable that the bisphenol type epoxy resin is bisphenol F-type epoxy resin.

(23) In the resin filler described in the item (20) or (21), it is favorable that a viscosity of the resin filler is $0.3 \times 10^5$–$1.0 \times 10^5$ cps (30–100 Pa·s), preferably $0.45 \times 10^2$–$0.65 \times 10^2$ Pa·s at a temperature of $23 \pm 1°$ C.

Moreover, the viscosity of the resin filler is dependent upon the temperature measured as shown in FIG. 6. This figure shows a relation between the viscosity measured at 6 rpm (revolution number per minute) by means of a rotational viscometer and the measuring temperature.

(24) In the resin filler described in the item (20) or (21), it is favorable that the inorganic particles have an average particle size of 0.1–5.0 μm.

(25) A build-up multilayer printed circuit board in which an interlaminar insulating layer and a conductor layer are alternately laminated on a surface of a wiring substrate having a conductor circuit cr a through-hole and the conductor layers are electrically connected to each other through a viahole formed in the interlaminar insulating layer, characterized in that a resin filler of non-solvent comprising a bisphenol type epoxy resin as a resin component and an imidazole curing agent as a curing agent is filled in a concave portion created on the surface of the wiring substrate or in the through-hole formed in the substrate.

(26) A build-up multilayer printed circuit board in which an interlaminar insulating layer and a conductor layer are alternately laminated on a surface of a wiring substrate having a conductor circuit or a through-hole and the conductor layers are electrically connected to each other through a viahole formed in the interlaminar insulating layer, characterized in that a resin filler of non-solvent comprising a bisphenol type epoxy resin as a resin component, an imidazole curing agent as a curing agent and ceramic filler is filled in a concave portion created on the surface of the wiring substrate or in the through-hole formed in the substrate.

(27) A build-up multilayer printed circuit board in the item (25) or (26) a roughend layer is formed on a conductor face of an inner wall of the through-hole.

BRIEF DESCRIPTION OF THE DRAWINGS

FIGS. 3(a)–3(i) is a flow chart showing the production of the multilayer printed circuit board according to the invention in Example 10.

Here, numeral 1 is a substrate, 2 an insulating layer, 3 an adhesive layer, 4 a plating resist, 5, 6 and 7 plated films (conductor layer, conductor pattern), 5' and 6' plated films requiring interlaminar insulation (conductor layer, conductor pattern), 8 an opening for viahole, 9 a viahole (BVH), 10 an organic resin filler, 11 a heat-resistant resin particle, 12 a copper foil, 13 a through-hole, and 14 a resin filler.

DETAILED DESCRIPTION

Figure 1A:
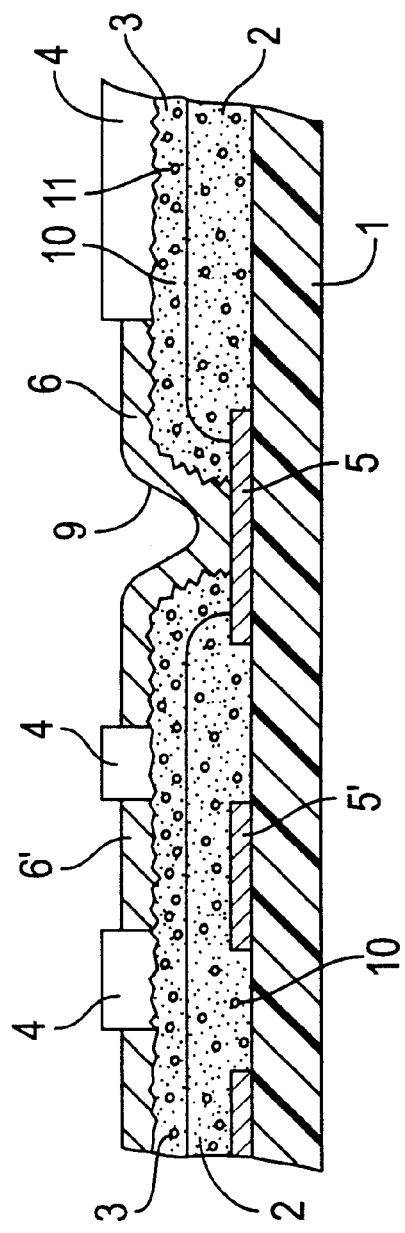
FIGS. 1(a) and 1(b) are schematically sectional views illustrating an embodiment of the resin insulating layer in the multilayer printed circuit board according to the invention.
Figure 1B:
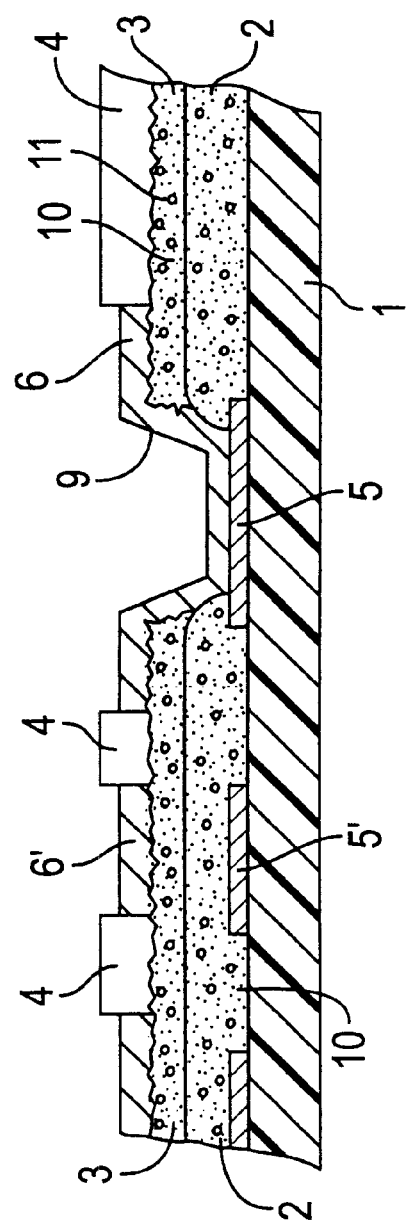

A first feature of the invention lies in a point that the resin insulating layer is rendered into a composite of a lower layer and an upper layer and the lower layer is constructed with an unroughenable insulating layer made from a heat-resistant resin hardly soluble in the acid or oxidizing agent, preferably resin an insulating layer made from a heat-resistant resin containing an organic resin filler hardly soluble in the acid or oxidizing agent and the upper layer is constructed with a roughenable adhesive layer for electroless plating made from a heat-resistant resin, preferably an adhesive layer made from a heat-resistant resin containing cured heat-resistant resin particles soluble in the acid or oxidizing agent (see FIG. 1 and FIG. 2).

According to such a resin insulating layer, the lower layer is the unroughenable insulating layer made from the heat-resistant resin hardly soluble in the acid or oxidizing agent, preferably the insulating layer made from the heat-resistant resin containing an organic resin filler hardly soluble in the acid or oxidizing agent, so that even when the thickness of the resin insulating layer is thin, the roughening does not arrive at the lower layer due to the promotion thereof and hence the improvement of the interlaminar insulation property of the printed circuit board can be improved. On the other hand, in the resin insulating layer according to the invention, the upper layer is the roughenable adhesive layer for electroless plating made from the heat-resistant resin, preferably the roughenable adhesive layer made from the heat-resistant resin containing cured heat-resistant resin particles soluble in the acid or oxidizing agent, so that clear anchors are formed by roughening and hence a high conductor adhesion density (peel strength) can be obtained.

Moreover, the cured heat-resistant resin particles soluble in the acid or oxidizing agent constitutting the adhesive layer may take various shapes such as particulate shape, hollow shape, broken piece and the like. Preferably, they are selected from ① particles having an average particle size of not more than 10 μm, ② aggregate particle having an average particle size of 2–10 μm obtained by aggregating heat-resistant resin powder having an average particle size of not more than 2 μm, ③ mixture of heat-resistant resin powder having an average particle size of 2–10 μm and heat-resistant resin powder having an average particle size of not more than 2 μm, and ④ false particles obtained by adhering at least one of heat-resistant resin powder having an average particle size of not more than 2 μm and inorganic powder having an average particle size of not more than 2 μm to surfaces of heat-resistant resin powder having an average particle size of 2–10 μm. When the average particle size exceeds 10 μm, the anchor becomes deeper and hence so-called fine pattern of not more than 100 μm can not be formed, while when the average particle size is less than 2 μm, clear anchor can not be formed. Among the above ①–④, the resin particles ②–④ are particularly desirable. Because they can form complicated anchors and improve the peel strength.

The compounding amount of the cured heat-resistant resin particles is desirable to be 5–100 per 100 of resin solid content of the heat-resistant resin matrix on a weight ratio. When the weight ratio is less than 5, the clear anchor can not be formed, while when it exceeds 100, the kneading is difficult and the amount of the heat-resistant resin matrix is relatively decreased to lower the strength of the adhesive layer.

Moreover, the anchor recess formed on the surface of the adhesive layer is desirable to have an average depth of not more than 15 μm, whereby the conductor pattern can be rendered into a fine pattera of not more than L/S=50/50 μm.

On the other hand, in the resin insulating layer of the above structure according to the invention, the insulating layer of the lower layer is possible to be made from only the heat-resistant resin without using the organic resin filler. In this case, the developing residue created in the development can be suppressed and the rejection number can be decreased.

And also, it is favorable to include the thermoplastic resin in the insulating layer constituting the resin insulating layer according to the invention because the cracking hardly occurs in the adhesive layer or viahole portion owing to the flexibility inherent to the thermoplastic resin.

The insulating layer containing the thermoplastic resin is particularly desirable to be made from a resin composite of a thermosetting resin (a part of thermosetting group may be substituted with a photosensitive group) and a thermoplastic resin. Because, the acid resistance and the resistance to oxidizing agent are ensured by the rigid skeleton of the thermosetting resin and the toughness is ensured by the flexibility of the thermoplastic resin, whereby there can be obtained a circuit board strong to heat cycle or the like. As the thermosetting resin constituting the resin composite, use may be made of phenolic resin, amino resin such as melamine resin or urea resin, epoxy resin, epoxy-modified polyimide resin, unsaturated polyester resin, polyimide resin, urethane resin, diallylphthalate resin and the like. Particularly, novolac type epoxy resin such as phenol novolac, cresol novolac or the like is preferable as the epoxy resin because it has a rigid skeleton through the arrangement of benzene rings and is excellent in tie resistance to oxidizing agent and the acid resistance. As the thermoplastic resin, use may be made of polyether sulphoie, polysulphone, phenoxy resin, polyether imide, polystyrene, polyethylene, polyarylate, polyamidoimide, polyphenylene sulfide, polyether ether ketone, polyoxybenzonate, polyvinyl chloride, polyvinyl acetate, polyacetal, polycarbonate acid the like. Particularly, polyether sulphone is favorable in view of toughness and compatibility with epoxy resin.

As mentioned above, the resin insulating layer according to the invention is the structure of the layer composite consisting of the adhesive layer as an upper layer and the insulating layer as a lower layer, in which these layers allot function of bewaring the adhesion of conductor and function of bearing the insulation between conductors to each, so that even if the resin insulating layer is thin, there can be stably provided printed circuit boards simultaneously satisfying excellent peel strength and interlaminar insulation property.

In the resin insulating layer according to the invention, it is preferable that the thickness of the insulating layer as the lower layer is 10–100 μm. When the thickness of the insulating layer is less than 10 μm, the function as the resin insulating layer is apt to be insufficient, while when the thickness of the insulating layer exceeds 100 μm, the resin insulating layer is formed at a thickness larger than the required level and is uneconomical.

The adhesive layer is an upper layer is preferable to have a thickness of 10–50 μm. Because, the roughened surface having a sufficient thickness can be formed when the thickness of the adhesive layer is not less than 10 μm, and the function as the adhesive can effectively be developed when the thickness of the adhesive layer is within a range of 10–50 μm.

Furthermore, the amount of the organic resin filler filled in the insulating layer as the lower layer is favorable to be 10–100 parts by volume based on 100 parts by volume of the heat-resistant resin. Because, when the amount is within the above range, the viscosity in the application can be maintained to a preferable range and the resin layer having a uniform thickness can easily be formed.

The organic resin filler is heat-resistant resin particles hardly soluble in the acid or oxidizing agent, which are preferable to have a maximum particle size corresponding to not more than 8/10 of the thickness of the insulating layer and an average particle size corresponding to not more than ½ of the thickness of the insulating layer, and are more favorable to have a maximum particle size corresponding to not more than ½ of the thickness of the insulating layer and an average particle size corresponding to not more than ⅓ of the thickness of the insulating layer. Because, when the maximum particle size exceeds 8/10 of the thickness of the insulating layer, the cracks dividing the insulating layer are apt to be caused.

When the heat-resistant resin particle hardly soluble in the acid or oxidizing agent is a heat-resistant resin particle hardly soluble in the acid, epoxy resin can be used (the use of imidazole curing agent, acid anhydride cured product or the like). In case of heat-resistant resin particle hardly soluble in the oxidizing agent, there can be used resin particles of benzoguanamine resin, styrene resin, divinylbenzene resin, polyimide resin or the like.

Moreover, it is considered that inorganic filler is used instead of the organic resin filler. However, when the inorganic filler is used, the reflection of the exposed light may be diffused by the inorganic filler, so that there is undesirably caused a new problem that the resolution of the resin insulating layer is lowered in the formation of viahole (BVH).

An important feature of the invention lies in a point that when a certain acid or oxidizing agent is used, the lower layer is formed by dispersing the heat-resistant resin particles insoluble in the acid or oxidizing agent into the hardly soluble heat-resistant resin and the upper layer is formed by dispersing the heat-resistant resin particles soluble in the acid or oxidizing agent into the hardly soluble heat-resistant resin. Particularly, when the heat-resistant resin particles filled in the lower layer and upper layer have a thermal expansion coefficient lower than that of the heat-resistant resin as a substrate, the resistance to cooling-heating shock in the printed circuit board can be improved.

In the invention, there is proposed the insulating layer as a lower layer having such a structure that cured heat-resistant resin particles soluble in acid or oxidizing agent and having an average particle size of 0.1–2.0 μm, preferably 0.1–1.0 μm, more preferably 0.1–0.6 μm, more particularly 0.3–0.5 μm are dispersed into the heat-resistant resin hardly soluble in the acid or oxidizing agent as another method of preventing electric conduction between the upper conductor circuit layer and lower conductor circuit layer due to the excessive roughening of the resin insulating layer.

Figure 5A:
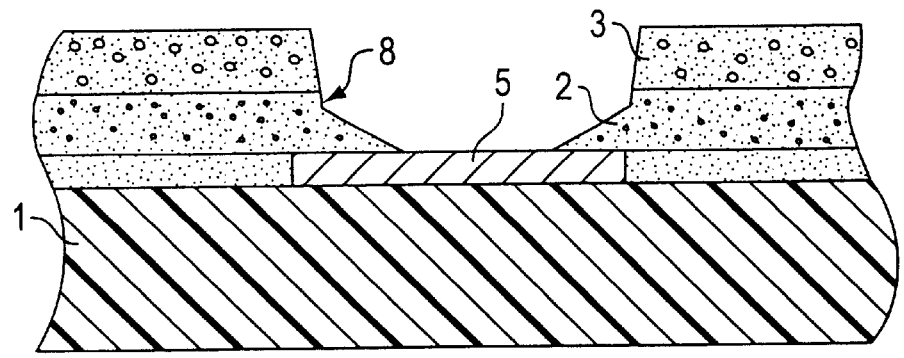
FIGS. 5(a)–5(c) are diagrammatic views illustrating a step of forming the viahole when finer resin particles soluble in an acid or oxidizing agent are dispersed in an insulating layer as a lower layer.
Figure 5B:
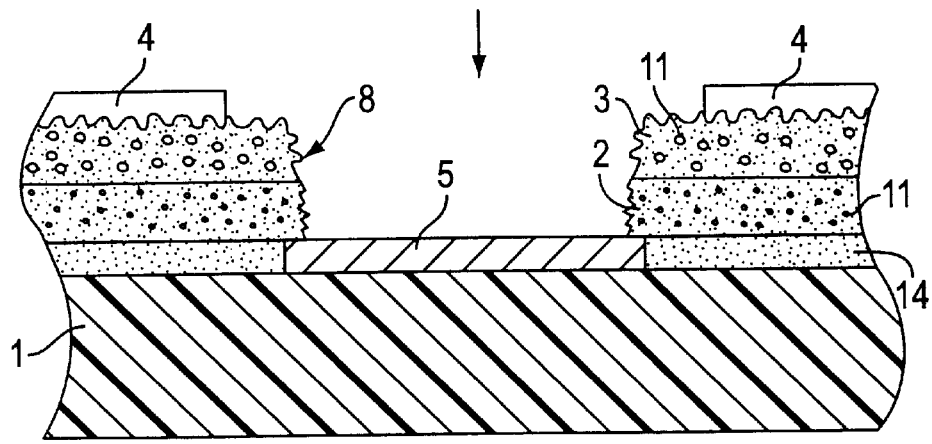
Figure 5C:
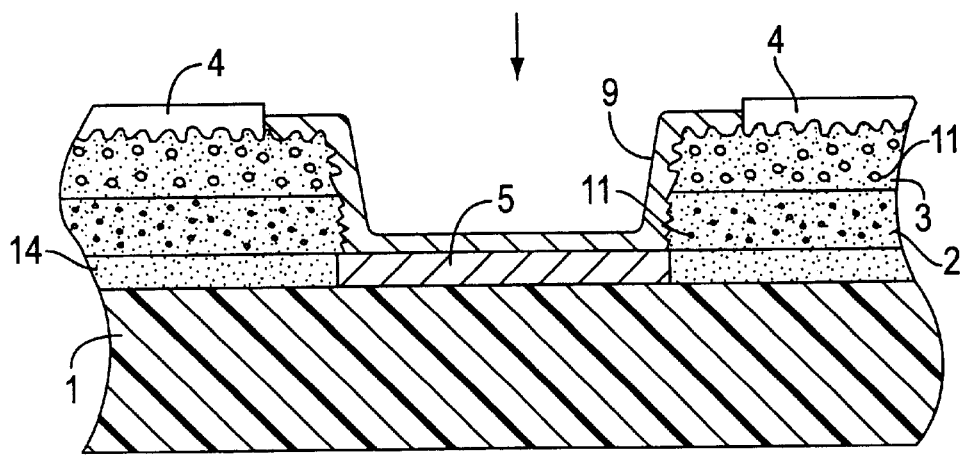

According to such a structure, the cured fine resin particles dispersed in the resin matrix and having an average particle size of 0.1–2.0 μm do not communicate with each other through the roughening treatment and also poor insulation is not caused even in the roughening. Furthermore, the fine resin particles having an average particle size of 0.1–2.0 μm are less in the diffused reflection of the exposed light and hence are excellent in the resolution. And also, when the interlaminar insulating layer (the adhesive layer and the insulating layer) is subjected to a light exposure and development, there may be created the poor development (development residue) of the interlaminar insulating layer resulted from poor adhesion of the developing solution (see FIG. 5(a)). In this case, when fine resin particles dissolving in the acid or oxidizing agent are existent in the insulating layer, if the poor development is caused, these fine resin particles are dissolved at the step of the roughening treatment with the acid or oxidizing agent and hence the resin matrix may be dissolved and broken to remove the remaining resin (see FIG. 5(b)). On the thus formed side wall of the opening for viahole are formed fine anchors in addition to the anchor on the adhesive layer of the upper layer when the fine resin particles dissolving in the acid or oxidizing agent are dispersed in the insulating layer of the lower layer, so that the adhesion strength of the viahole is more improved (see FIG. 5(c)). However, when the fine resin particles have an average particle size of less than 0.1 μm, the anchor effect or the effect of removing the development residue is not caused, while when the average particle size exceeds 2.0 μm, the excessive roughening may be created to cause the electric conduction between the upper and lower conductor circuit layers. Therefore, the average particle size of the resin particles is desirable to be 0.1–2.0 μm.

In the resin insulating layer according to the invention, the heat-resistant resin used in the production of the printed circuit board is constituted by properly compounding a thermosetting resin, a thermosetting resin partly provided with a photosensitivity, a photosensitive resin, a resin composite of thermosetting resin or photosensitive resin and thermoplastic resin, a photoinitiator, a photoinitiator promoter, a curing agent and the like and added with heat-resistant resin fine particles, if necessary.

(1) As the thermosetting resin, there is preferably used at least one resin selected from phenolic resin, amino resin such as melamine resin or urea resin, epoxy resin, epoxy-modified polyimide resin, unsaturated polyester resin, polyimide resin, urethane resin, diallylphthalate resin, allyl resin and urea resin.

(2) As the thermosetting resin partly provided with a photosensitivity, there is preferably used a partly acrylated phenol novolac type epoxy resin or cresol novolac type epoxy resin. Moreover, the acrylation is carried out by reacting the epoxy resin with acrylic acid, methacrylic acid or the like. The acrylation ratio means a percentage of a portion of the epoxy group reacted with acrylic acid or methacrylic acid and may easily be changed, if necessary.

(3) As the photosensitive resin, there are preferably used the conventionally known single-functional or multi-functional photosensitive resins such as acrylic resin, tripropylene glycol diacrylate, trimethylol propane triacrylate, pentaerythrito triacrylate, polyethylene glycol diacrylate, epoxy acrylate and the like.

(4) As the thermoplastic resin, there is preferably used at least one resin selected from polyether sulphone, polysulphone, phenoxy resin, polyether imide, polystyrene, polyethylene, polyarylate, polyamideimide, polyphenylene sulfide, polyether ether ketone, polyoxybenzonate, polyvinyl chloride, polyvinyl acetate, polyacetal and polycarbonate.

(5) As the resin composite of thermosetting resin or photosensitive resin and thermoplastic resin, PES-modified epoxy resin, PES-modified acrylic resin and the like are preferably used.

(6) As the photoinitiator, there is preferably used at least one of ① intramolecular bond cleavage type compound such as benzoisobutyl ether, benzyldimethyl ketal, diethoxyacetophenone, acyloxym ester, chlorinated acetophenone, hydroxyacetophenone or the like, and ② intermolecular hydrogen drawing type compound such as benzophenone, Michlar ketone, dibenzosuberone, 2-ethyl anthraquinone or the like.

(7) As the photoinitiator promotor, there is preferably used at least one of triethanol amine, methyldiethanol amine, triisopropanol amine, Michlar ketone, 4,4-diethylamino benzophenone, 2-dimethylaminoethyl benzoic acid, 4-dimethylamino benzoic acid ester, (n-butoxy)ethyl 4-dimethylamino benzoate, isoamyl 4-dimethylamino benzoate, 2-ethylhexyl 4-dimethylamino benzoate, polymerizable tertiary amine and the like.

(8) As the curing agent, DICY, amine curing agent, acid anhydride, imidazole curing agent and the like are favorably used in case of epoxy resin and its photo-sensitized product. Particularly, it is preferably to contain 2–10 wt % of the imidazole curing agent as a solid content. When the content of the imidazole curing agent exceeds 10 wt %, the resin is too cured and becomes brittle, while when it is less than 2 wt %, the curing of the resin is insufficient and the satisfactory resin strength is not obtained. As the curing agent for the other thermosetting resin, there are used the conventionally known ones.

As the heat-resistant resin used in the resin insulating layer according to the invention, the resin containing no solvent can be used as it is, but the resin dissolved in the solvent can advantageously be used in case of particularly producing the sheet-like resin insulating layer because the adjustment of the viscosity is easy and the resin particles can uniformly be dispersed and the application is easy to the base film.

As the solvent dissolving the heat-resistant resin, mention may be made of usual solvents such as methylethyl ketone, methylcellosolve, ethylcellosolve, butylcellosolve, butylcellosolve acetate, butyl carbitol, butylcellulose, tetraline, dimethylformamide, normalmethyl pyrolidone and the like.

Moreover, the heat-resistant resin may properly be compounded with additives such as coloring matter (pigment), leveling agent, anti-foaming agent, ultraviolet ray absorbing agent, flame retarder and the like, or other filler.

A second feature of the invention lies in a point that a resin is filled in a concave portion of conductor useless part removed from the conductor circuit as a lower layer formed by so-called subtractive process of etching the substrate provided with the conductor layer to remove the conductor useless part at the same level as the surface of the conductor circuit.

According to the structure that the conductor circuit is formed as a lowest layer through the subtractive process and the resin is filled in the concave portion of the removed conductor layer, the surfaced of the substrate provided with the conductor circuit becomes smooth, and the resin insulating layer having a uniform thickness can be formed on such a substrate by the application. As a result, the thickness of the resin insulating layer becomes uniform and the exposure and development conditions can be unified and hence the peeling of the resin insulating layer by the poor development or excessive development is not created. Therefore, when plural conductor circuit layers are laminated thereon through the additive process, each conductor layer becomes smooth and the shape of the viahole is not distorted and hence the multilayer printed circuit board having excellent connection reliability and mounting reliability can stably be provided.

In such a structure according to the invention, the resin filled in the concave portion of the conductor useless part removed is desirable to be a non-solvent resin. Because, the durability is improved without causing the peeling from the resin insulating layer by gradually evaporating solvent through heat from an electronic part mounted.

Further, in the structure according to the invention, the resin filled in the concave portion of the conductor useless part removed is desirable to contain inorganic particles. Because, when it contains the inorganic particles, the curing shrinkage is small and the warping of the substrate is small. Furthermore, the thermal expansion coefficient is small and the resistance to heat cycle is improved. Moreover, the water absorbing ratio is small and the resistance to base and the insulation property are improved.

The resin filler used as the filling resin according to the invention lies in a point that bisphenol type epoxy resin (molecular weight: about 150–180) is used as a resin component. The resin filler using such an epoxy resin is low in the viscosity, so that the viscosity can be adjusted to a given range without diluting with a solvent and hence it is possible to sufficiently fill in the concave portion created on the surface of the substrate (between conductor circuits or viahole) or in the through-hole formed in the substrate.

In the resin filler according to the invention, it is desirable that the viscosity is adjusted to a range of $0.3 \times 10^5$ cps–$1.0 \times 10^5$ cps ($0.3 \times 10^2$ Pa·s–$1.0 \times 10^2$ Pa·s) at a temperature of $23 \pm 1°$ C. When the viscosity is too high, it is difficult to conduct the filling operation of the resin filler, while when it is too low, the resin filler is apt to be flowed out and the satisfactory filling can not be attained. Moreover, the adjustment of the viscosity in the resin filler is carried out by the amount of the curing agent added or the average particle size and amount of the inorganic particles added. And also, the viscosity of the resin filler can be adjusted by the temperature in the filling operation.

When the bisphenol type epoxy resin is used as the resin component, the epoxy resin after the curing through polymerization is rich in the flexibility as compared with novolac type epoxy resin having a rigid skeleton. Therefore, the polishing operation of the substrate surface after the filling and curing of the resin filler becomes easy and the cracking is hardly caused through the polishing.

As the bisphenol type epoxy resin, bisphenol A-type epoxy resin and bisphenol F-type epoxy resin are desirable. Particularly, bisphenol F-type epoxy resin is preferable from a viewpoint of viscosity adjustment. In the bisphenol F-type epoxy resin, hydrogen is bonded to carbon between phenyl groups instead of methyl group, so that the molecular chain is easy in the motion and the fluidity is rich at an uncured state and the flexibility is rich at a cured state.

In the resin filler according to the invention, an imidazole curing agent is used as the curing agent. The epoxy resin obtained by polymerization-curing the epoxy resin as the resin component of the resin filler (monomer or oligomer) with the imidazole curing agent is excellent in the heat resistance, resistance to chemicals and resistance to oxidizing agent or base. As a result, the resin filler according to the invention becomes excellent in the heat resistance, resistance to chemicals and resistance to oxidizing agent and base at the cured state. Particularly, the resin filler according to the invention is advantageous in the production of the build-up multilayer when the surface of the interlaminar insulating layer is roughened with the oxidizing agent or the plating is carried out by immersing in a strong base electroless plating solution. Because, the epoxy resin cured by a curing agent other than the imidazole curing agent is decomposed by the above treatment.

Further, the epoxy resin polymerization-cured by the imidazole curing agent is hydrophobic and hardly absorbs water. Therefore, the insulation resistance between the conductor circuits formed on the wiring substrate never lowers due to the water absorption by the cured resin filler.

As the imidazole curing agent, mention may be made of 2-methyl imidazole (trade name: 2MZ), 4-methyl-2-ethyl imidazole (trade name: 2E4MZ), 2-phenyl imidazole (trade name: 2PZ), 4-methyl-2-phenyl imidazole (trade name: 2P4MZ), 1-benzyl-2-methyl imidazole (trade name: 1B2MZ), 2-ethyl imidazole (trade name: 2EZ), 2-isopropyl imidazole (trade name: 2IZ), 1-cyanoethyl-2-methyl imidazole (trade name: 2MZ-CN), 1-cycanoethyl-2-ethyl-4-methyl imidazole (trade name: 2E4MZ-CN), 1-cyanoethyl-2-undecyl imidazole (trade name: $C_{11}Z$-CN) and the like.

Particularly, it is desirable to use a liquid imidazole curing agent at 25° C., which includes, for example, 1-benzyl-2-methyl imidazole (trade name: 1B2MZ), 1-cyanoethyl-2-ethyl-4-methyl imidazole (trade name: 2E4MZ-CN) and 4-methyl-2-ethyl imidazole (trade name: 2E4MZ). In the invention, the resin component containing no solvent is used, so that it is difficult to uniform knead the resin component with powdery imidazole curing agent, while the uniform kneading of the resin component with the liquid imidazole curing agent is easy.

It is desirable that the amount of the imidazole curing agent is 1–10% by weight in the resin filler because when the amount is within the above range, the viscosity of the resin filler is easily adjusted.

In the resin filler according to the invention, it is desirable that 60–80% of all monomer is reacted in the curing treatment after the filling. When the reaction rate is adjusted to the above range, the resin hardness enough to easily conduct the polishing is obtained.

The resin filler according to the invention is mainly composed of the above resin component and the imidazole curing agent and further contains inorganic particles as an additive component. In this case, the shrinkage by the curing of the resin filler is less and the warping of the substrate is not caused. Further, the cured resin filler is small in the linear thermal expansion coefficient and excellent in the resistance to heat cycle.

The epoxy resin obtained by polymerization-curing the bisphenol type epoxy resin is easy in the polishing and rich in the flexibility as compared with the novolac type epoxy resin having a rigid skeleton, but the shrinkage after the curing and thermal expansion coefficient become large. In this connection, when the inorganic particles are added as an additive component to the resin filler, problems due to the shrinkage after the curing and the thermal expansion coefficient can be compensated and hence the resin filler containing inorganic particles becomes optimum in the build-up multilayer printed circuit board. Since the inorganic particles do not absorb water, the water absorption of the resin filler can be reduced and hence the lowering of the insulation resistance between the conductor circuits due to the water absorption of the resin filler can be prevented.

As the inorganic particle, mention may be made of ceramic fillers such as silica, alumina, mullite, zirconia and the like.

The inorganic particles are favorable to have an average particle size of 0.1–5.0 μm. In case of the ceramic filler, the average particle size is about 0.5–2.0 μm. When the particle size is too fine, the viscosity of the resin filler is too high and the filling operation is difficult, while when it is too rough, the smoothness of the surface is lost.

The amount of the inorganic particles compounded is desirable to be about 1.0–2.0 times to the amount of the bisphenol type epoxy resin. When the amount of the inorganic particles is within the above range, the viscosity of the resin filler is easily adjusted to $0.3\times10^5$ cps–$1.0\times10^5$ cps ($0.3\times10^2$ Pa·s–$1.0\times10^2$ Pa·s) at $23\pm1°$ C.

The best embodiment of the multilayer according to the invention is a multilayer comprising upper and lower layers of conductor circuit and a resin insulating layer electrically insulating therebetween, characterized in that the conductor circuit of the lower layer is formed by subjecting a substrate provided with a conductor layer to an etching treatment to remove a conductor useless portion, and a concave portion formed by the removal of the conductor uselessd portion is filled with a resin so as to be the same plane as the surface of the conductor circuit, and the resin insulating layer is constituted with a composite layer comprised of an insulating layer made from a heat-resistant resin hardly soluble in acid or oxidizing agent as a lower layer and an adhesive layer for electroless plating made from a heat-resistant resin as an upper layer, and the conductor circuit of the upper layer is formed on the adhesive layer constituting the upper layer of the resin insulating layer.

On the conductor circuit formed on the substrate through the subtractive process are successively formed the insulating layer and the adhesive layer to form a the resin insulating layer of the two layers, which is simultaneously cured (exposure treatment) and developed for the formation of an opening for viahole. Therefore, if the surface of the substrate provided with the conductor circuit of the lower layer is not smooth, there is caused an unevenness at the boundary face between the insulating layer as the lower layer and the adhesive layer as the upper layer. In this case, there is caused no problem under the usual service condition, but when the is used under conditions of high temperature, high humidity and the like, the resin absorbs water or expands through heat and hence stress concentration may be caused at the boundary face between the insulating layer as the lower layer and the adhesive layer for electroless plating as the upper layer to create the peeling.

In the multilayer of the above structure according to the invention, however, the surface of the substrate provided with the conductor circuit of the lower layer is smoothened by the filling resin, so that the peeling of the insulating layer and the adhesive layer through the heat expansion or water absorption as mentioned above can completely be prevented.

Further, in the multilayer printed circuit board of the above structure according to the invention, the insulating layer as the lower layer can be rendered into a structure that cured heat-resistant resin particles soluble in acid or oxidizing agent and having an average particle size of 0.1–2.0 um are dispersed in the heat-resistant resin hardly soluble in acid or oxidizing agent. According to this structure, the fine resin particles dispersed in the resin matrix and having an average particle size of 0.1–2.0 μm do not communicate with each other through the roughening treatment as previously mentioned or do not cause the poor insulation even if they are roughened. Furthermore, the development residue can be removed without lowering the resolution of the resin insulating layer and hence the adhesion property to the viahole can be improved.

Figure 7A:
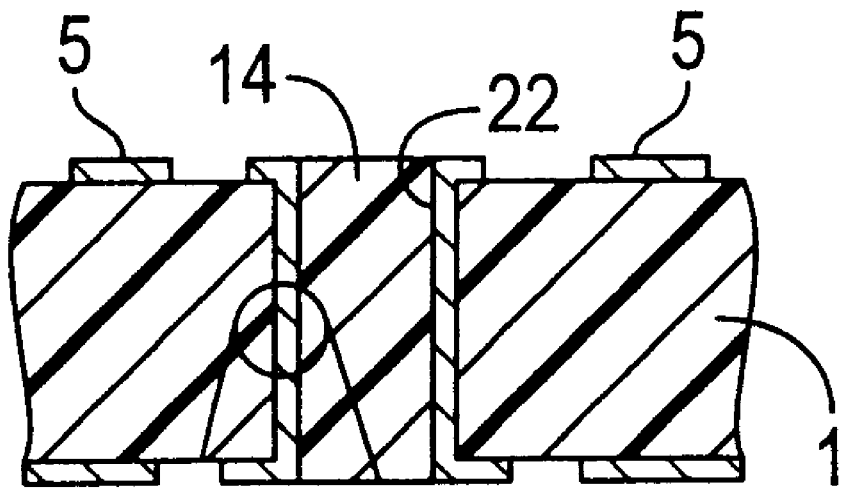
FIG. 7(a) is a sectional view illustrating an embodiment of the present invention in which a through-hole includes an inner wall having a conductor surface thereon, the conductor surface having, a roughened laycer.
Figure 7B:
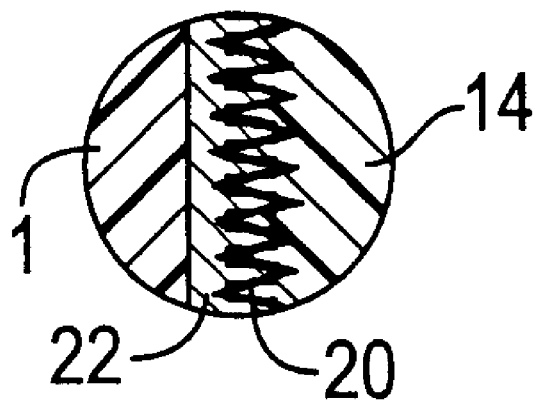
FIG. 7(b) is an enlarged view of a portion of FIG. 7(a).

In the multilayer printed circuit board according to the invention, it is desirable that the roughened layer 20 is formed in the conductor 22 surface on the inner wall of the through-hole filled with the resin filler 14, whereby the adhesion property between the conductor in the inner wall of the through-hole and the resin filler is improved (see FIGS. 7(*a*) and 7(*b*)). As a result, ① there can be prevented the occurrence of cracks due to the expansion and shrinkage in the reliability test such as cool-heat cycle ($-65°$ C. $\leftrightarrow 125°$ C.), test for resistance to soldering (immersion test at $230°$ C.) or the like, and ② the gap at the boundary between the conductor in the inner wall of the through-hole and the filler is not created in the curing shrinkage of the resin, so that the penetration of the plating solution or the like can be controlled.

Moreover, the roughened layer is also formed on the conductor surface other than the inner wall of the through-hole, so that the adhesion property between the conductor as the lower layer and the insulating layer or solder resist can be improved when the insulating layer is formed for the multilayer formation or when the solder resist is formed to supply the solder.

As the roughened layer formed on the conductor surface in the inner wall of the through-hole, there are needle-like alloy layer obtained by electroless copper-nickel-phosphorus plating or the like, blackened layer obtained by oxidation treatment of copper, blackened reduced layer obtained by oxidation and reduction treatments of copper, blown reduced layer, and physical roughened layer obtained by physical method such as sand blast, shot blast, buff polishing, wrapping or the like.

Among them, the needle-like alloy layer obtained by electroless copper-nickel-phosphorus plating or the like is desirable. Such an alloy layer is needle-like, so that the adhesion property to the resin filler is excellent and also it is strong in the toughness and is hard and hardly cracks and is excellent in the heat cycle property. In this case, it is desirable that the amounts of copper, nickel and phosphorus in the copper-nickel-phosphorus alloy layer are about 90–96%, 1–5% and 0.5–2 wt %, respectively. When they are within the above ranges, the precipitated film has a needle structure and is excellent in the anchor effect.

The composition of the electroless plating bath for the formation of such a needle-like alloy layer is desirable to have copper sulfate: 1–40 g/l, nickel sulfate: 0.1–6.0 g/l, citric acid: 10–20 g/l, hypophosphite: 10–100 g/l, boric acid: 10–20 g/l and surfactant: 0.01–10 g/l. In order to form the needle-like alloy layer, the presence of the surfacetant is required and must satisfy the above range. When the amount is outside the above range, the plated film constituting the precipitated roughened layer is not dense and the heat cycle property considerably lowers.

As the electroless plating conditions, it is desirable that a temperature of a plating bath is $60-80°$ C., pH is a strong base of about 8.5–10, a bath ratio is 0.01–1.0 dm$^2$/l, a precipitating rate is 1–3 μm/10 minutes and a plating time is 5–20 minutes.

The thus obtained needle-like roughened copper-nickel-phosphorus alloy layer is favorable to have a thickness of 0.5–7.0 μm, preferably 1.0–5.0 μm, more particularly 1.5–3.0 μm. When the thickness of the roughened layer is thicker than 7.0 μm, the long plating time is taken and hence there is caused a fear of increasing the production cost and the material cost and also the needle-like film itself becomes brittle and the space to the resin filler is easily created. While, when it is thinner than 0.5 μm, the anchor effect is insufficient and the space to the resin filler is easily created. Moreover, the thickness of the roughened layer (copper-nickel-phosphorus alloy layer) means a distance from the smooth conductor surface in the inner wall of the through-hole to the top of the needle-like alloy.

In the invention, when the roughened layer formed in the inner wall of the through-hole is the electroless copper-nickel-phosphorus needle-like alloy layer or the like, it is desirable that the roughened layer is protected with a tin layer. Because, the alloy plated layer is apt to be dissolved in acid or oxidizing agent and hence the dissolution thereof is prevented to maintain the roughened layer. Further, the tin layer prevents the oxidation of the roughened layer to improve the wettability between the roughened layer and the resin filler and also prevents the occurrence of the space between the roughened layer and the resin filler to improve the adhesion property and further may control the occurrence of cracking or the like when being applied to heat cycle or the like.

Furthermore, tin is a metal being industrially cheap and less in the toxicity and does not cause color change through acid or oxidizing agent and can maintain the gloss. And also, tin is a metal precipitated by the substitution reaction with copper and can cover the copper-nickel-phosphorus needle-like alloy layer without breaking this layer.

Since tin is precipitated by the substitution reaction with copper, once it is substituted with copper in the surface layer, the substitution reaction is completed to form a very thin film layer covering the needle-like alloy of the roughened layer. Therefore, the needle-like alloy of the roughened layer is maintained at its sharp form and the adhesion property between the roughened layer and the tin plated layer is excellent.

The method of producing the multilayer printed circuit board according to the invention is characterized by comprising the following steps (a)–(e) in the production of the multilayer printed circuit board electrically insulating the conductor circuits of the upper and lower layers through the resin insulating layer.

(a) step of forming the conductor circuit of the lower layer by etching the substrate provided with the conductor layer to remove the conductor useless portion.

(b) step of applying a resin to the substrate having the concave portion formed by the removal of the conductor useless portion and thereafter curing the resin.

(c) step of polishing the resin cured in the step of the item (b) until the conductor circuit of the lower layer is exposed.

(d) step of forming the resin insulating layer.

(e) step of forming the conductor circuit of the upper layer on the resin insulating layer.

An embodiment of the production method of the multilayer printed circuit board according to the invention will concretely be described below.

(1) At first, the conductor circuit of the lower layer is formed on the substrate by subjecting the substrate provided with the conductor layer to an etching treatment according to the step (a).

The etching treatment of the substrate is carried out, for example, by subjecting a copper lined laminate to light exposure and development to form a photosensitive etching resist and immersing in an etching solution such as copper chloride to remove the useless portion of the conductor layer and leave only a necessary conductor circuit portion.

(2) The resin is applied to the substrate having the concave portion through the removal of the conductor useless portion obtained in the step (a) and cured to fill the resin in the concave portion, and further the surface of the filling resin is polished so as to be the same plane as the surface of the conductor circuit until the conductor circuit of the lower layer including land portion of the through-hole or viahole is exposed because when the filling resin is adhered to the conductor circuit, the poor electrical conduction is caused.

As the resin filling in the concave portion, it is desirable to use the aforementioned resin filler.

The polishing of the filling resin is desirable to be carried out at a state of not completely curing the resin. That is, the filling resin is desirable to be cured at a polishable state (60–80% of all functional groups is cured) but at a state of being not completely cured because it is soft and easy in the polishing.

Moreover, the polishing of the filling resin can be carried out by a belt sander method, a buff polishing method or the like.

(3) The resin insulating layer is formed on the surface of the substrate filling the resin in the concave portion between the conductor circuits (see the step (d)).

Since the resin insulating layer is formed on the surface of the substrate treated through the steps (a)–(c), the thickness is uniform and hence an opening for viahole can be formed with a high dimensional accuracy. As a result, the poor insulation due to the overetching, poor shape or the like is not caused in the viahole to be formed through the additive process, and also the surface of the upper conductor circuit layer becomes smooth and the connection reliability and mounting reliability are excellent.

In the invention, the resin insulating layer is preferable to be a composite layer comprised of an insulating layer made from a heat-resistant resin hardly soluble in acid or oxidizing agent as a lower layer and an adhesive layer for electroless plating formed by dispersing resin particles soluble in acid or oxidizing agent into the heat-resistant resin matrix hardly soluble in acid or oxidizing agent as an upper layer. In this case, the curing of the resin insulating layer forming the opening for the viahole is carried out by simultaneously curing the insulating material and the adhesive. In this point, according to the invention, the surface of the lower conductor circuit layer is smoothened by the filling resin as previously mentioned, whereby the peeling of the adhesive layer and the insulating layer in the cure-shrinking can be prevented. Here, the heat-resistant resin constituting the resin insulating layer is constructed by properly compounding a thermosetting resin, a thermosetting resin partly imparting the photosensitivity, a photosensitive resin, a resin composite of thermosetting resin or photosensitive resin and thermoplastic resin, a photoinitiator, a photoinitiator promoter, a curing agent and the like, and if necessary, adding heat-resistant resin particles.

In the production method of the multilayer printed circuit board according to the invention, the insulating layer as the lower layer can be rendered into a structure that heat-resistant resin particles soluble in acid or oxidizing agent and having an average particle size of 0.1–2.0 μm, preferably 0.1–1.0 μm, more preferably 0.1–0.6 μm, more particularly 0.3–0.5 μm are dispersed in the heat-resistant resin hardly soluble in acid or oxidizing agent. According to this structure, the fine resin particles dispersed in the resin matrix and having an average particle size of 0.1–2.0 μm do not communicate with each other through the roughening treatment as previously mentioned or do not cause the poor insulation even if they are roughened. Furthermore, when the fine resin particles having an average particle size of 0.1–2.0 μm are used, the development residue can be removed without lowering the resolution of the resin insulating layer and hence the adhesion property to the viahole can be improved.

Particularly, the formation of the opening for the viahole in the resin insulating layer (composite layer) made from the photosensitized heat-resistant resin is carried out, for example, by the following method.

①. The insulating material is applied onto the substrate provided with the conductor circuit by means of a roll coater or the like, dried, exposed and developed to obtain the insulating layer provided with the opening for the viahole (BHV). Then, the adhesive for electroless plating is applied onto the insulating layer by means of a roll coater or the like, dried, exposed and developed to obtain the adhesive layer provided with the smaller size opening for BVH at the same position as the opening for BVH in the insulating layer. Next, these layers are simultaneously photocured and thermoset to form the opening for the viahole in the resin insulating layer constituted with the composite layer consisting of the insulating layer and the adhesive layer.

②. The insulating material is applied onto the substrate provided with the conductor circuit by means of a roll coater and dried to obtain the insulating layer at B-stage state. Then, the adhesive for electroless plating is applied onto the insulating layer by means of a roll coater and dried to obtain the adhesive layer at B-stage state. Thereafter, these layers are simultaneously exposed and developed to form the opening for the viahole.

As the method of forming the resin insulating layer on the substrate, a method of sticking a resin film formed by rendering the material for the layer into a film shape or a prepreg formed by impregnating the material for the layer in fibers can be adopted in addition to the above application method.

(4) Then, the surface of the resin insulating layer formed in the above item (3) is roughened according to usual manner using acid or oxidizing agent and a catalyst is applied and fixed to the roughened surface of the resin insulating layer. Next, if necessary, a resist printed into a given pattern is formed, and the catalyst is activated by an acid treatment and thereafter the electroless plating is conducted to form the conductor circuit of the upper layer. Further, the insulating material, adhesive and the like are applied onto the upper conductor circuit layer to gradually build up a subsequent layer, whereby the desired multilayer printed circuit board is obtained.

The roughening of the resin insulating layer can be carried out by immersing the substrate provided with the resin insulating layer in a solution of the oxidizing agent or the like, or by spraying the solution of the oxidizing agent or the like onto the surface of the resin insulating layer.

As the acid roughening the resin insulating layer, use may be made of hydrochloric acid, sulfuric acid and organic acids, while the oxidizing agent may include chromic acid, chromate, permanganate, ozone and the like.

As the plating resist, use may be made of commercially available ones, which includes, for example, an acrylated product of a novolac type epoxy resin such as phenol novolac, cresol novolac or the like.

As the method of electroless plating, mention may be made of electroless copper plating, electroless nickel plating, electroless tin plating, electroless gold plating, electroless silver plating and the like. Among them, at least one of electroless copper plating, electroless nickel plating and electroless gold plating is preferable. Furthermore, different electroless plating or electrolytic plating or soldering may be applied to the above electroless plated film.

In the invention, the surface of the resin insulating layer is smooth, so that the thickness of the plating resist formed by applying the liquid plating resist is uniform and the resolution thereof is improved. Therefore, after the formation of the upper conductor circuit layer, the surface of this layer is further polished so as to render the surfaces of the plating resist and the upper conductor circuit layer into the same plane. Thus, the surface of the multilayer printed circuit board can be always smoothened even if the building-up of the conductor circuit layer through the additive process is repeated. In the building-up of the conductor circuit layer, therefore, it is possible to prevent the accumulation of unevenness. As a result, even if a fine part is attached to the multilayer printed circuit board, since the surface of the board is smooth, the terminals of the part can adequately be connected without floating and hence the mounting reliability can be improved. However, the smoothening through polishing is carried out only to the conductor circuit layer built up by the subtractive process but is not applied to the conductor circuit layer built up by the subsequent additive process, which is effective to reduce the production cost for the multilayer printed circuit board.

EXAMPLE 1

(1) 70 parts by weight of a 50% acrylated product of cresol novolac type epoxy resin (made by Nippon Kayaku Co., Ltd.), 30 parts by weight of bisphenol A-type epoxy resin (made by Yuka Shell Co., Ltd.), 5 parts by weight of benzophenone, 0.5 part by weight of Michlar ketone, 60 parts by weight of benzoguanamine particle (made by Nippon Shokubai Co., Ltd., trade name: Eposter, 0.5 μm) as an organic resin filler 10 hardly soluble in an imidazole curing agent and oxidizing agent are mixed and added with butylcellosolve acetate to adjust a viscosity to 30 pa·s in a homodisper agitating machine, which are further kneaded through three rolls to obtain an insulating material.

(2) 70 parts by weight of a 50% acrylated product of cresol novolac type epoxy resin (made by Nippon Kayaku Co., Ltd.), 30 parts by weight of bisphenol A-type epoxy resin (made by Yuka Shell Co., Ltd.), 5 parts by weight of benzophenone, 0.5 part by weight of Michlar ketone, 20 parts by weight at 5.5 μm and 10 parts by weight at 0.5 μm of epoxy resin particle (epoxy resin particle using an amine curing agent) as a heat-resistant resin particle 11 soluble in an imidazole curing agent and oxidizing agent are mixed and added with butylcellosolve acetate to adjust a viscosity to 30 pa·s in a homodisper agitating machine, which are further kneaded through three rolls to obtain an adhesive.

(3) The insulating material obtained in the above item (1) is applied onto a substrate 1 provided with a copper pattern formed by etching at a thickness of 40 μm by means of a roll coater, dried, exposed and developed to obtain an insulating layer 2 provided with an opening for blind viahole (BVH).

(4) The adhesive obtained in the above item (2) is applied onto the insulating layer 2 obtained in the above item (3) at a thickness of 20 μm by means of a roll coater, dried, exposed and developed to obtain an adhesive layer 3 provided with an opening for BVH having a size smaller than that of the opening for BVH of the insulating layer in the same position as the opening for BVH of the insulating layer. Then, the insulating layer 2 and the adhesive layer 3 are photocured and thermoset (photocuring: 3 J/cm², setting: 80° C.×1 hour+100° C.×1 hour+120° C.×1 hour+150° C.×15 hours) to obtain a resin insulating layer provided with an opening 8 for BVH having a diameter of 70 μmφ.

(5) Then, the surface of the resin insulating layer is roughened according to usual manner using an oxidizing agent and thereafter Pd catalyst is applied onto the roughened surface of the resin insulating layer, which is heat-treated to fix a catalyst nucleus.

(6) Next, the substrate is preheated to 80° C. and a plating resist 4 (dry film resist) is heat-pressed thereonto at 100° C., which is then exposed, developed, UV-cured and heat-treated in the usual manner to form a resist 4 printed with a given pattern. Moreover, 1,1,1-trichloroethane is used as a developing solution.

(7) After the catalyst is activated by an acid treatment, electroless plating is carried out by immersing in an electroless copper plating solution having a composition shown in Table 1 according to usual manner to form necessary conductor patterns 5, 6, 5', 6' and viahole (BVH) 9 (see FIG. 1(*a*)). Further, the steps on and after the above item (3) are repeated 2 times to produce a multilayer printed circuit board having 4 conductor layers.

In this example, the formations of the openings for BVH in the lower layer and the upper layer are carried out separately, but these formations may simultaneously be made. The latter case is as shown in FIG. 1(*b*).

TABLE 1

| Copper sulfate | 0.06 mol/l |
|---|---|
| Formalin (37%) | 0.30 mol/l |
| Sodium hydroxide | 0.35 mol/l |
| EDTA | 0.35 mol/l |
| Additive | slight |
| Plating temperature | 70–72° C. |
| pH | 12.4 |

EXAMPLE 2

A multilayer printed circuit board is produced in the same manner as in Example 1 except that 50 parts by weight of styrene particle (made by Sumitomo Chemical Co., Ltd. trade name: Finepearl, 3 μm) is used as the organic resin filler 10 constituting the insulating layer and insoluble in the oxidizing agent and the thickness of the insulating layer 2 is 60 μm and the thickness of the adhesive layer is 20 μm.

EXAMPLE 3

A multilayer printed circuit board is produced in the same manner as in Example 1 except that 80 parts by weight of divinylbenzene particle (made by Sekisui Fine Chemical Co., Ltd. trade name: Micropearl, 1.0 μm) is used as the organic resin filler 10 constituting the insulating layer and insoluble in the oxidizing agent and the thickness of the insulating layer 2 is 70 μm and the thickness of the adhesive layer is 10 μm.

COMPARATIVE EXAMPLE 1

A multilayer printed circuit board is produced in the same manner as in Example 1 except that the insulating material is not applied.

The interlaminar insulation resistance at a temperature of 85° C. and a humidity of 85%, peel strength of electroless plated film (adhesion property) and heat cycle property at −65° C.×10 minutes–125° C.×10 minutes (resistance to cool-heat shock) are measured with respect to the thus produced multilayer printed circuit boards. The results are shown in Table 2.

As seen from the results of Table 2, it has been confirmed that all of the multilayer printed circuit boards according to the invention exhibit excellent properties as compared with the comparative example in which the resin insulating layer is not constituted with the insulating layer 2 and adhesive layer 3 having different properties.

TABLE 2

|  | Interlaminar insulation resistance (Ω) *1 | Peel strength (kg/cm) | Heat cycle property (cycle) *2 |
|---|---|---|---|
| Example |  |  |  |
| 1 | $2.5 \times 10^{14}$ | 1.8 | 1000 OK |
| 2 | $5.4 \times 10^{14}$ | 1.8 | 1000 OK |
| 3 | $6.1 \times 10^{14}$ | 1.8 | 1000 OK |
| Comparative Example 1 | $4.8 \times 10^{6}$ | 1.8 | 1000 OK |

EXAMPLE 4

(1) 70 parts by weight of a 25% acrylated product of cresol novolac type epoxy resin (made by Nippon Kayaku Co., Ltd.), 25 parts by weight of polyether sulphone (made by Mitsui Toatsu Co., Ltd.), 4 parts by weight of benzophenone, 0.4 part by weight of Michlar ketone and an imidazole curing agent are mixed and added with normalmethyl pyrolidone (NMP) to adjust a viscosity to 30 pa·s in a homodisper agitating machine, which are further kneaded through three rolls to obtain an insulating material.

(2) 70 parts by weight of a 25% acrylated product of cresol novolac type epoxy resin (made by Nippon Kayaku Co., Ltd.), 25 parts by weight of polyether sulphone (made by Mitsui Toatsu Co., Ltd.), 4 parts by weight of benzophenone, 0.4 part by weight of Michlar ketone, an imidazole curing agent, 60 parts by weight at 5.0 μm and 15 parts by weight at 1.0 μm of melamine resin particle (made by Ibiden Co., Ltd.) as a heat-resistant resin particle 11 soluble in an acid and oxidizing agent are mixed and added with normalmethyl pyrolidone (NMP) to adjust a viscosity to 30 pa·s in a homodisper agitating machine, which are further kneaded through three rolls to obtain an adhesive.

(3) The insulating material obtained in the above item (1) is applied onto a substrate 1 provided with a copper pattern formed by etching at a thickness of 30 μm by means of a roll coater and dried, and thereafter the adhesive obtained in the above item (2) is applied thereonto at a thickness of 20 μm by means of a roll coater, dried, exposed, developed, photocured and thermoset to obtain a resin insulating layer provided with an opening 8 for BVH.

(4) Then, the surface of the resin insulating layer is roughened according to usual manner using permanganic acid-phosphoric acid and thereafter Pd catalyst is applied onto the roughened surface of the resin insulating layer, which is heat-treated to fix a catalyst nucleus.

(5) Next, a liquid plating resist is applied and then exposed, developed, photocured and thermoset to form a resist 4 printed with a given pattern.

Figure 2A:
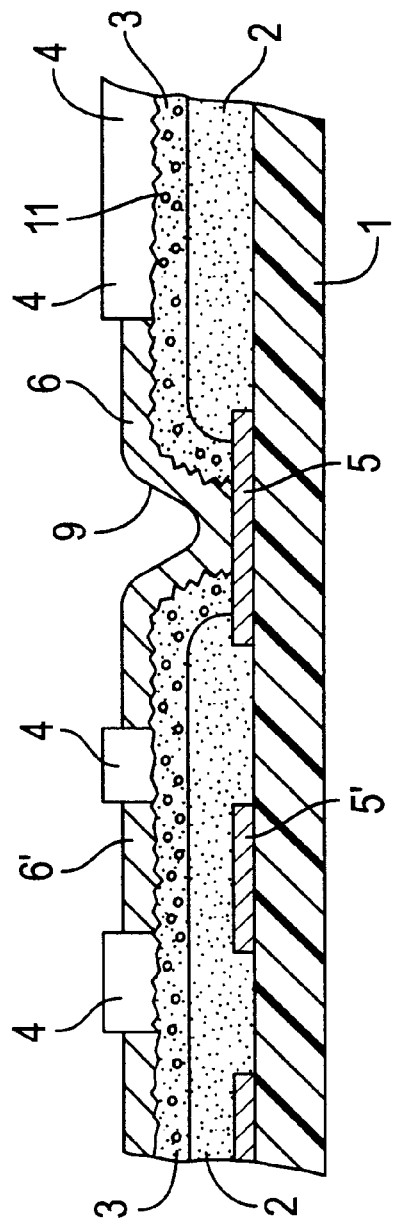
FIGS. 2(a) and 2(b) are schematically sectional views illustrating another embodiment of the resin insulating layer in the multilayer printed circuit board according to the invention.
Figure 2B:
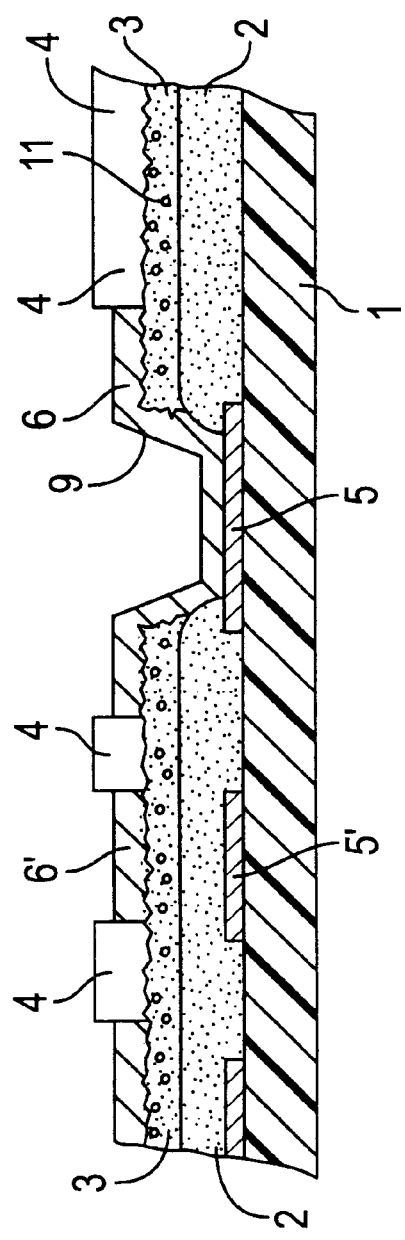
Figure 4A:
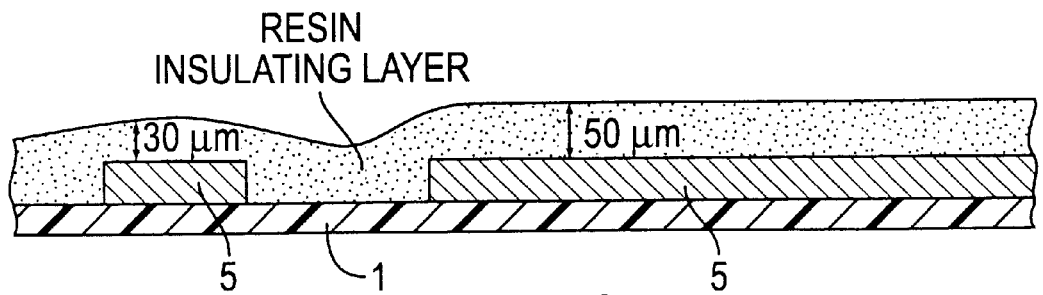
FIGS. 4(a)–4(c) are partial section views illustrating a forming state of the resin insulating layer, wherein (a) shows a case that the thickness of the insulating layer becomes thick as the conductor area becomes large, (b) shows a state of an opening for viahole when the exposure and development conditions are matched with a this portion of the resin insulating layer, and (c) shows a state of an opening for viahole when the exposure and development conditions are matched with a thick portion of the resin insulating layer.
Figure 4B:
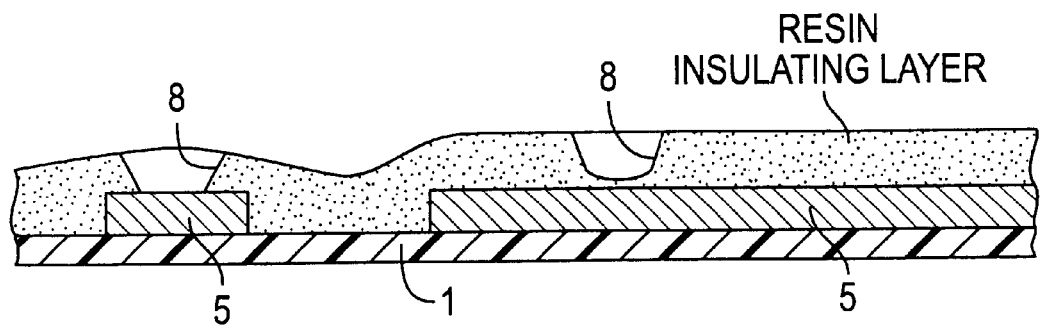
Figure 4C:
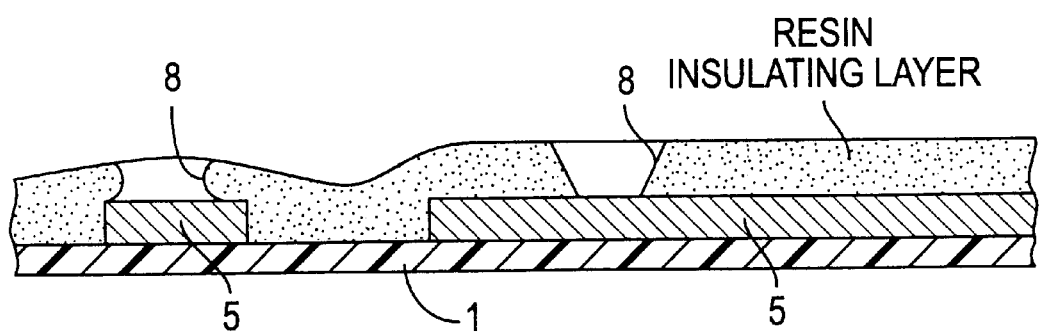

(6) After the catalyst is activated by an acid treatment, electroless plating is carried out to form necessary conductor patterns 5, 6, 5', 6' and viahole (BVH) 9 (see FIG. 2(b)). Further, the steps on and after the above item (3) are repeated 2 times to produce a multilayer printed circuit board having 4 conductor layers.

Moreover, FIG. 2(a) is a case that the insulating layer and the adhesive layer are separately pierced to form openings 8 for BVH.

EXAMPLE 5

A multilayer printed circuit board is produced in the same manner as in Example 4 except that 20 parts by weight at 5.5 μm and 10 parts by weight at 0.5 μm of epoxy resin filler are mixed as a heat-resistant resin particle 11 constituting the adhesive and soluble in an acid and oxidizing agent.

EXAMPLE 6

A multilayer printed circuit board is produced in the same manner as in Example 4 except that the thickness of the insulating material applied to the substrate is 20 μm.

COMPARATIVE EXAMPLE 2

A multilayer printed circuit board is produced in the same manner as in Example 4 except that the insulating layer is not formed.

COMPARATIVE EXAMPLE 3

A multilayer printed circuit board is produced in the same manner as in Example 4 except that silica filler (made by Admatext, 0.5 μm) is mixed with the insulating material. In this case, the minimum opening size for BVH formable in the resin insulating layer is 70 μm, but the sidewall of BVH is tapered-form. This is due to the fact that the exposing light is turned beneath the mask through the diffused reflection of light by the silica filler.

The interlaminar insulation resistance at a temperature of 85° C. and a humidity of 85%, peel strength of electroless plated film (adhesion property) and BVH resolution of resin insulating layer are measured with respect to the thus produced multilayer printed wiring boards. The results are shown in Table 3.

As seen from the results of this table, it has been confirmed that the multilayer printed wiring boards according to the invention, in which the resin insulating layer is constituted with the insulating layer 2 and the adhesive layer 3 having different properties, exhibit excellent properties as compared with the comparative example using one-layer structure as the resin insulating layer. Further, in the structure of the resin insulating layer according to the invention, even if the thickness of the resin insulating layer is thin, the multilayer printed wiring board having an excellent interlaminar insulation resistance can be provided without lowering the peel strength.

TABLE 3

| | Interlaminar insulation resistance (Ω) *1 | Peel strength (kg/cm) | BVH resolution (umφ) *2 |
|---|---|---|---|
| Example | | | |
| 4 | $3.2 \times 10^{12}$ | 2.0 | 80 |
| 5 | $2.4 \times 10^{12}$ | 2.1 | 100 |

TABLE 3-continued

| | Interlaminar insulation resistance (Ω) *1 | Peel strength (kg/cm) | BVH resolution (umφ) *2 |
|---|---|---|---|
| 6 | $8.0 \times 10^{11}$ | 2.0 | 70 |
| Comparative Example | | | |
| 2 | $1.3 \times 10^{9}$ | 2.0 | 140 |
| 3 | $7.9 \times 10^{11}$ | 1.9 | 70 tapered |

*1: Interlaminar insulation resistance
The insulation resistance is measured after a voltage of 24 V is applied at a temperature of 85° C. and a humidity of 85% for 1000 hours.
*2: BVH resolution
A minimum opening size for BVH formable in the resin insulating layer is measured.

EXAMPLE 7

A multilayer printed wiring board is produced in the same manner as in Example 4 except that an insulating material formed by mixing 70 parts by weight of a 25% acrylated product of cresol novolac type epoxy resin (made by Nippon Kayaku Co., Ltd.), 5 parts by weight of benzophenone, 0.5 part by weight of Michlar ketone and an imidazole curing agent and adding normalmethyl pyrolidone (NMP) to adjust a viscosity to 30 Pa·a in a homodisper agitating machine and kneading through three rolls is used as the insulating material constituting the lower layer (insulating layer 2) of the resin insulating layer having a two-layer structure.

EXAMPLE 8

A multilayer printed wiring board is produced in the same manner as in Example 4 except that an insulating material formed by mixing 70 parts by weight of a 25% acrylated product of cresol novolac type epoxy resin (made by Nippon Kayaku Co., Ltd.), 30 parts by weight of bisphenol A-type epoxy resin (made by Yuka Shell Co., Ltd.), 5 parts by weight of benzophenone, 0.5 part by weight of Michlar ketone and an imidazole curing agent and adding normalmethyl pyrolidone (NMP) to adjust a viscosity to 30 Pa·s in a homodisper agitating machine and kneading through three rolls is used as the insulating material constituting the lower layer (insulating layer 2) of the resin insulating layer having a two-layer structure.

EXAMPLE 9

A multilayer printed wiring board is produced in the same manner as in Example 4 except that an insulating material formed by mixing 70 parts by weight of a 25% acrylated product of cresol novolac type epoxy resin (made by Nippon Kayaku Co., Ltd.), 30 parts by weight of phenol novolac type epoxy resin (made by Yuka Shell Co., Ltd.), 5 parts by weight of benzophenone, 0.5 part by weight of Michlar ketone and an imidazole curing agent and adding normalmethyl pyrolidone (NMP) to adjust a viscosity to 30 Pa·s in a homodisper agitating machine and kneading through three rolls is used as the insulating material constituting the lower layer (insulating layer 2) of the resin insulating layer having a two-layer structure.

The BVH resolution and interlaminar insulation resistance are measured with respect to the thus obtained printed wiring boards. As a result, the board of Example 7 has an interlaminar insulation resistance of $3.1 \times 10^{12}$ Ω and BVH resolution of 80 μm, and the board of Example 8 has an interlaminar insulation resistance of $3.0 \times 10^{12}$ Ω and BVH resolution of 80 μm, and the board of Example 9 has an interlaminar insulation resistance of $3.1 \times 10^{12}$ Ω and BVH resolution of 80 μm.

As seen from these results, all boards of Examples 7, 8 and 9 are excellent in the BVH resolution likewise the board of Example 4 because the organic resin filler is not included in the insulating material. However, when the heat cycle of −65° C.×10 minutes⇒125° C.×10 minutes is measured, as seen from the results shown in Table 4, the cracking is not caused in the board of Example 4 until 2000 cycles, while the cracking is caused at 1200 cycles in the board of Example 7, at 1200 cycles in the board of Example 8 and at 1200 cycles in the board of Example 9. This is considered to be due to the following facts: that is, in the board of Example 1, polyether sulphone (PES) as a thermoplastic resin is included in the insulating layer, so that the cracking hardly occurs due to the flexibility of the insulating layer. Particularly, the insulating layer of Example 4 is constituted with the resin composite of thermosetting resin and thermoplastic resin, so that it is excellent in the resistance to the oxidizing agent and the acid resistance. That is, the form of the board in Example 4 is excellent in all of BVH resolution, interlaminar insulation resistance and resistance to heat cycle (resistance to cool-heat shock).

EXAMPLE 10

(1) A copper lined laminate plate formed by laminating copper foil 12 of 18 μm in thickness on both surfaces of a substrate 1 made from glass epoxy resin or BT (bismaleimide triazine) resin having a thickness of 1 mm is used as a starting material (see FIG. 3(a)). After the copper lined laminate plate is drilled and a plating resist is formed thereon, electroless plating is carried out to form a through-hole 13 and further conductor useless portions of the copper foil 12 are etched in form of a pattern to form innerlayer copper patterns 5, 5' on both surfaces of the substrate 1 (see FIG. 3(b)).

(2) 100 parts by weight of bisphenol F-type epoxy resin (made by Yuka Shell Co., Ltd. molecular weight: 172, trade name: E-807) is mixed with 6 parts by weight of an imidazole curing agent (made by Shikoku Kasei Co., Ltd. trade name: 2E4MZ-CN) and further the resulting mixture is mixed with 170 parts by weight of $SiO_2$ particles having an average particle size of 1.6 μm (the maximum size of the particulate is not more than thickness (15 μm) of the following innerlayer copper pattern) and kneaded through three rolls to obtain a resin for the smoothening of the substrate having a viscosity of 100,000 cps (hereinafter referred to as a filling resin 14 simply).

(3) The filling resin 14 is printed at a thickness of 20 μm on one-side surface of the substrate provided with the innerlayer copper patterns 5, 5' in the above item (1) by means of a screen printing machine and the resulting resin layer is cured by subjecting to a heat treatment at 150° C. for 30 minutes. The same resin layer is formed on the other side surface in the same manner as described above (see FIG. 3(c)). Moreover, the printing is carried out under conditions that a printing speed is 0.2 m/s and a printing pressure is 50 kg/cm² by using a screen printing plate of 200 mesh. If the filling resin 14 is heated at 150° C. for 3 hours, it is substantially completely cured to be a high hardness. In this step, however, the resin is cured to a level capable of conducting belt sander polishing or buff polishing in order to facilitate the polishing operation of the filling resin.

(4) The one-side surface of the substrate provided with the resin layer in the above item (3) is polished with a belt polishing paper of #600 (made by Sankyo Rikagaku Co., Ltd.) in a belt sander so as not to leave the filling resin on the surface of the innerlayer copper pattern. Then, buff polishing is carried out for removing scratches created by the belt sander. Such a series of polishings are carried out on the other surface of the substrate likewise the above case. Then, the filling resin 14 filled in the through-holes 13 is completely crosslinked by heating at 150° C. for 3 hours to obtain the substrate smoothened on both surfaces by the filling resin 14 (see FIG. 3(d)). Moreover, there can be adopted a method of carrying out belt sander polishing and subsequent buff polishing or a method of carrying out only the buff polishing so as to slightly leave the filling resin 14 on the surface of the innerlayer copper pattern.

(5) On the other hand, the insulating material is obtained by mixing 70 parts by weight of a 25% acrylated product of cresol novolac type epoxy resin (made by Nippon Kayaku Co., Ltd.), 25 parts by weight of polyether sulphone (made by Mitsui Toatsu Co., Ltd.), 4 parts by weight of benzophenone, 0.4 part by weight of Michlar ketone and an imidazole curing agent and adding normalmethyl pyrolidone (NMP) to adjust a viscosity to 30 Pa·s in a homodisper agitating machine and kneading them through three rolls.

(6) 70 parts by weight of a 25% acrylated product of cresol novolac type epoxy resin (made by Nippon Kayaku Co., Ltd. molecular weight: 2500). 30 parts by weight of polyether sulphone (made by Mitsui Toatsu Co., Ltd.), 5 parts by weight of benzophenone (made by Kanto Kagaku Co., Ltd.) as a photoinitiator, 0.4 part by weight of Michlar ketone as a photoinitiator, 4 parts by weight of an imidazole curing agent (made by Shikoku Kasei Co., Ltd. trade name: 2E4MZ-CN), 10 parts by weight of caprolactone-modified tris(acroxyethyl)isocyanurate (made by Toa Gosei Co., Ltd. trade name: Aronix M325) as a photosensitive monomer, 35 parts by weight at 5.5 μm and 5 parts by weight at 0.5 μm of epoxy resin filler (made by Toray Co., Ltd. trade name: Torepearl) as a heat-resistant resin particle 11 soluble in acid or oxidizing agent are mixed and added with normalmethyl pyrolidone (NMP) to adjust a viscosity to 12 Pa·s in a homodisper agitating machine and further kneaded through three rolls to obtain a photosensitive adhesive. The photosensitive adhesive is formed by dispersing the heat-resistant resin particles 11 soluble in a roughening solution such as chromic acid, phosphoric acid or the like into the resin matrix hardly soluble in the roughening solution.

(7) The insulating material obtained in the item (5) is applied onto both surfaces of the substrate smoothened in the item (4) by means of a roll coater and left at a horizontal state for 20 minutes and dried at 60° C. (prebaked) to form an insulating layer 2 (see FIG. 3(e)).

Further, the photosensitive adhesive obtained in the item (6) is applied onto the insulating layer 2 by means of a roll coater, left at a horizontal state for 20 minutes and dried at 60° C. (prebaked) to form an adhesive layer 3 (see FIG. 3(f)).

(8) A polyethylene terephthalate (PET) film provided on a back surface with a tackifier is stuck on both surfaces of the substrate provided with the insulating layer 2 and the adhesive layer 3 in the item (7) to shut off contacting with oxygen obstructing the polymerization reaction. Then, a photomask film printed with viaholes is placed thereonto, which is exposed to a light from a superhigh pressure mercury lamp of 400 mJ/cm². After the photomask film is taken out, the substrate is exposed to a light from a superhigh pressure mercury lamp of about 3000 mJ/cm². After the peeling of the PET film, the substrate is developed with triethylene glycol dimethylether (DMTG).

Thereafter, heat treatment is carried out at 150° C. for 5 hours (postbaked) to form a resin insulating layer (two-layer structure) of 50 µm provided with an opening (opening for the formation of viahole) 8 having an excellent size accuracy corresponding to the photomask film (see FIG. 3(*g*)).

(9) The surface of the resin insulating layer is roughened by using a roughening solution such as chromic acid, potassium permanganate or the like according to usual manner. Concretely, the substrate provided with the resin insulating layer is immersed in chromic acid at 70° C. for 20 minutes to dissolve and remove the heat-resistant resin particles dispersed in the surface of the adhesive layer constituting the resin insulating layer, whereby the roughened surface provided with many fine anchors is formed on the surface of the adhesive layer.

(10) A catalyst nucleus required for initial precipitation of electroless plating metal is given to the surface of the resin insulating layer roughened in the item (9) by treating in a solution of $PdCl_2 \cdot 2H_2O$: 0.2 g/l, $SnCl_2 \cdot 2H_2O$: 15 g/l, HCl: 30 g/l, and then a commercially available liquid photoresist is applied to the surface of the resin insulating layer at a thickness of 60 µm, dried and subjected to light exposure and development to form a plating resist 4 (line width 50 µm).

(11) After the catalyst nucleus is activated by treating with an aqueous solution of 100 g/l sulfuric acid, a primary plating is carried out by using an electroless copper-nickel alloy plating bath having the following composition to form a copper-nickel-phosphorus plated thin film having a thickness of about 1.7 µm on the non-resist formed portion. In this case, the temperature of the plating bath is 60° C. and the plating immersion time is 1 hour.

Metal salt . . . $CuSO_4 \cdot 5H_2O$: 6.0 mM (1.5 g/l) . . . $NiSO_4 \cdot 6H_2O$: 95.1 mM (25 g/l)

Complexing agent . . . $Na_3C_6H_5O_7$: 0.23 M (60 g/l)

Reducing agent . . . $NaPH_2O_2 \cdot H_2O$: 0.19 M (20 g/l)

pH adjusting agent . . . NaOH: 0.75 M (pH=9.5)

Stabilizer . . . lead nitrate: 0.2 mM (80 ppm)

Surfactant: 0.05 g/l

Precipitation rate: 1.7 µm/hr

(12) The substrate subjected to the primary plating treatment is taken out from the plating bath and washed with water to remove the plating solution remained on the surface thereof, which is treated with an acidic solution to remove oxide film from the surface layer of the copper-nickel-phosphorus thin film. Thereafter, the copper-nickel-phosphorus plated thin film is subjected to a secondary plating by using an electroless copper plating bath having the following composition without conducting Pd substitution, whereby necessary conductor patterns 6, 6' and viahole (BVH) 9 are formed (see FIG. 3(*h*)). In this case, the temperature of the plating bath is 50° C.–70° C. and the plating immersion time is 90 minutes–360 minutes.

Metal salt . . . $CUSO_4 \cdot 5H_2O$: 8.6 mM

Complexing agent . . . TEA: 0.15 M

Reducing agent . . . HCHO: 0.02 M

Others . . . stabilizer (bipyridyl, potassium ferrocyanide and the like): small

Precipitation rate: 6 µm/hr

(13) Both surfaces of the substrate provided with the conductor patterns 6, 6' and viahole (BVH) 9 in the items (11) (12) are polished with a #600 belt polishing pater in a belt sander and further buff-polished. In this case, the polishing is carried out so as to align the surface of the plating resist 4 with the surface of the conductor layer 6, 6' at the same plane.

(14) The steps of the items (7)–(13) are repeated to produce a multilayer printed circuit board having 6 layers on each surface (see FIG. 3(*i*)).

The interlaminar insulation resistance, BVH resolution and heat cycle property are evaluated under the conditions as mentioned above with respect to the thus obtained multilayer printed circuit board. As a result, the interlaminar insulation resistance is $3.1 \times 10^{12}$ Ω, and the BVH resolution is 80 µm, and the cracking is not created until 2000 times in the heat cycle test.

Further, when PCT (pressure cooker test) test is carried out together with the multilayer printed circuit board obtained in Example 4 as a comparative material, the peeling between the adhesive layer and the insulating layer is not observed in the board of this example. However, in the board of Example 1, there is observed a slight peeling (swelling) between the adhesive layer and the insulating layer. Although the reason is not clear, it is presumed that the board of Example 4 not filled with the filling resin in the concave portion between the conductor circuits has no problem under usual use conditions but when it is placed under conditions of high temperature and high humidity as in the PCT test, since the boundary between the adhesive layer and the insulating layer is uneven, the resin expands due to thermal expansion and water absorption and hence stress concentrates in the uneven portion to cause the peeling.

Moreover, the PCT test is carried out by leaving the specimen to stand under conditions of 2 atmospheric pressure, temperature of 121° C. and humidity of 100% for 200 hours.

EXAMPLE 11

In the item (5) of Example 10, 30 parts by weight of epoxy resin particles (made by Toray Co., Ltd. trade name: Torepearl) having an average particle size of 0.3 µm are compounded into the insulating material as a heat-resistant resin particle 11 soluble in acid or oxidizing agent. Further, the development of the interlaminar insulating material (adhesive and insulating material) is carried out by adopting a method of spraying to a vertically stood substrate (which means that normal vector of the substrate is perpendicular to vector of gravity). Thus, the multilayer printed circuit board is produced in the same manner a in Example 10.

The interlaminar insulation resistance, BVH resolution and heat cycle property are measured with respect to the thus obtained multilayer printed circuit board. As a result, the interlaminar insulation resistance is $3.2 \times 10^{12}$ Ω, and the BVH resolution is 90 µm, and the cracking is not created until 2000 times in the heat cycle test. Further, the peeling is not observed when the PCT test is carried out in the same manner as in Example 9.

In Example 11, the development residue is not observed though the spray development method is adopted while vertically standing the substrate.

The method of spraying the developing solution while vertically standing the substrate is very efficient in the production of both-side multilayer printed circuit board, and also the product is not affected by gravity and there is caused no difference in the properties between the front and back surfaces. Inversely, there may be slightly caused the occurrence of development residue in accordance with the intensity of the spraying and the hitting of the developing solution, but it is considered that slight development residue may be removed at the roughening step in the substrate of Example 11.

TABLE 4

| Example | 4 | 7 | 8 | 9 | 10 | 11 |
|---|---|---|---|---|---|---|
| Heat cycle | 2000 times OK | 1200 times crack | 1200 times crack | 1200 times crack | 2000 times OK | 2000 times OK |
| BVH resolution | 80 µm | 80 µm | 80 µm | 80 µm | 80 µm | 90 µm |
| Interlaminar insulation resistance (× $10^{12}$ Ω) | 3.2 | 3.1 | 3.0 | 3.1 | 3.1 | 3.2 |
| PCT test | peel | — | — | — | no peel | no peel |

EXAMPLE 12
(bisphenol F-type+silica)

(1) As a starting material, there is used a copper lined laminate plate obtained by laminating copper foil of 18 µm on both usrfaces of a substrate made from glass epoxy resin or BT (bismaleimide triazine) resin having a thickness of 1 mm. At first, the copper lined laminate plate is drilled and a plating resist is formed thereonto, which is subjected to an electroless plating treatment to form through-holes and further the copper foil is etched in a given pattern according to usual manner to form innerlayer copper patterns on both surfaces of the substrate.

Figure 6:
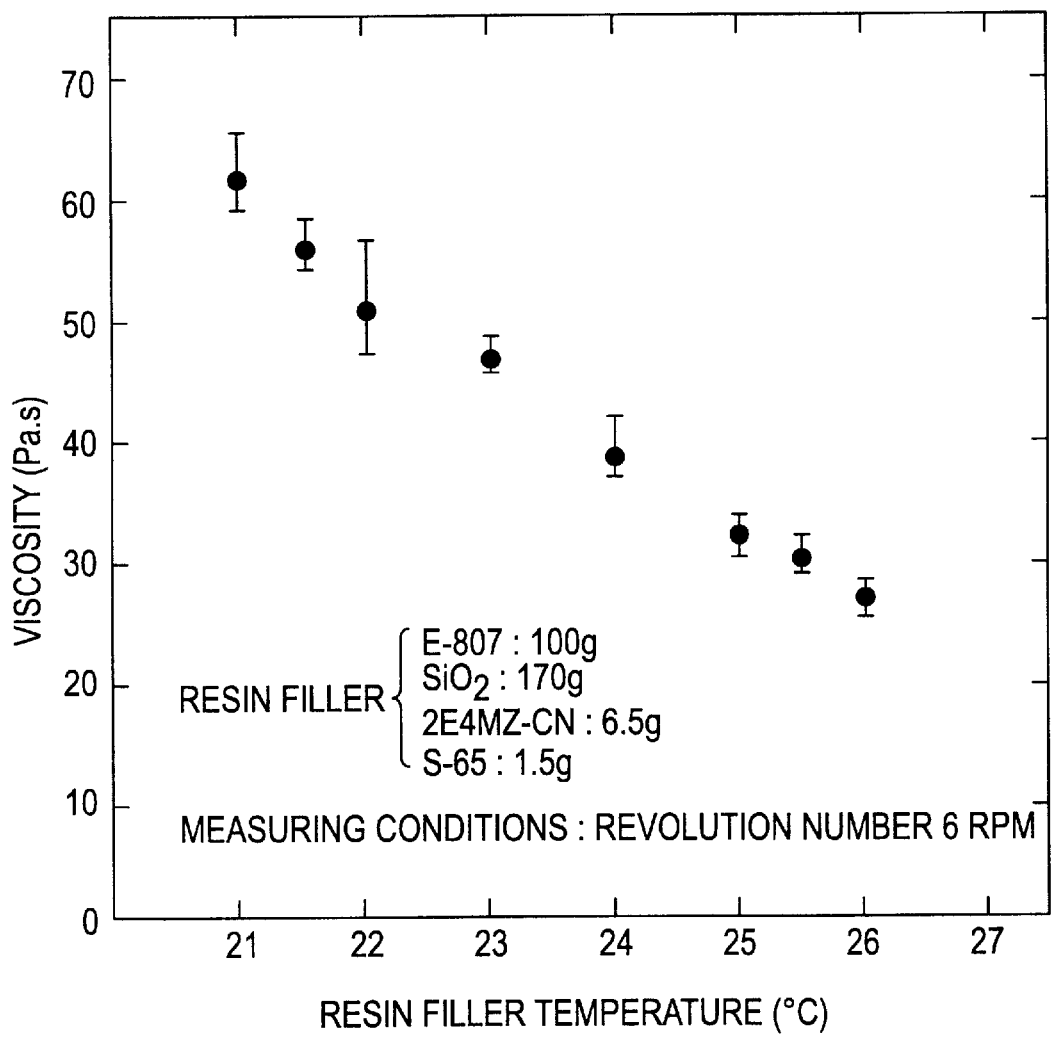
FIG. 6 is a diagrammatic view showing a relation between a viscosity of a resin filler and a measuring temperature.

(2) 100 parts by weight of bisphenol F-type epoxy resin (made by Yuka Shell Co., Ltd. molecular weight: 310, trade name: E-807) is mixed with 6 parts by weight of an imidazole curing agent (made by Shikoku Kasei Co., Ltd. trade name: 2E4MZ-CN) and further the resulting mixture is mixed with 170 parts by weight of $SiO_2$ spherical particles having an average particle size of 1.6 µm (the maximum size of the particulate is not more than the thickness (15 µm) of the following innerlayer copper pattern) and kneaded through three rolls to obtain a resin filler for the smoothening of the substrate having a viscosity of 45,000–49,000 cps at 23±1° C. (100,000 cps measured at 15±1° C., see results shown in FIG. 6 as measured at a revolution number of 6 rpm by means of a rotating viscometer).

The rein filler contains no solvent. If the resin filler contains a solvent, when an interlaminar material is applied and dried by heating at subsequent steps, the solvent evaporates from the resin filler layer to cause the peeling between the resin filler layer and the interlaminar material layer.

(3) The resin filler obtained in the item (2) is applied onto both surfaces of the substrate by means of a roll coater to fill between the conductor circuits or in the through-hole and then cured by subjecting to a heat treatment at 150° C. for 30 minutes. That is, the resin filler is filled between the innerlayer copper patterns or in the through-hole at this step.

Moreover, the resin filler is substantially and completely crosslinked by heating at 150° C. for 3 hours and rendered into a resin having a high hardness. In this step, therefore, the resin filler is cured to a range capable of conducting belt sander polishing or buff polishing in order to facilitate the polishing operation of the resin filler.

(4) The one-side surface of the substrate treated in the item (3) is polished by belt sander polishing using #600 belt polishing paper (made by Sankyo Rikagaku Co., Ltd.) in such a manner that the resin filler is not left on the surface of the innerlayer copper pattern or the land surface of the through-hole, and then buff-polished so as to remove scratches formed by the belt sander polishing. Such a series of polishings is applied to the other surface of the substrate. Then, the resin filler filled in the through-hole or the like is completely crosslinked and cured by heating at 150° C. for 3 hours to obtain the substrate in which both surfaces of the substrate are smoothened with the resin filler. That is, the surface of the resin filler and the surface of the innerlayer copper pattern are made to the same plane.

At this step, there can be adopted a method in which the belt sander polishing and subsequent buff polishing are carried out, or a method of conducting only the buff polishing in order to slightly leave the resin filler on the surface of the innerlayer copper pattern or the land surface of the through-hole. In the resin filler containing $SiO_2$ spherical particles, the shrinkage through curing is small and the warping of the substrate is not caused. And also, such a resin filler is less in the thermal expansion coefficient at the cured state and is excellent in the resistance to heat cycle.

(5) A photosensitive adhesive solution is obtained by mixing 70 parts by weight of a 25% acrylated product of cresol novolac type epoxy resin (made by Nippon Kayaku Co., Ltd. molecular weight: 2500) dissolved in DMDG (dimethyl glycol dimethylether), 30 parts by weight of polyether sulphone (PES), 4 parts by weight of an imidazole curing agent (made by Shikoku Kasei Co., Ltd. trade name: 2E4MZ-CN), 10 parts by weight of caprolacton-modified tris(acroxyethyl) isocyanurate (made by Toa Gosei Co., Ltd. trade name: Aronix M325) as a photosensitive monomer, 5 parts by weight of benzophenone (made by Kanto Kagaku Co., Ltd.) as a photoinitiator, 0.5 parts by weight of Michlar ketone (made by Kanto Kagaku Co., Ltd.) as a photosensitizer, 35 parts by weight at 5.5 µm on average and 5 parts by weight at 0.5 µm of epoxy resin particles, adding NMP to adjust a viscosity to 12 Pa·s in a homodisper agitating machine and kneading them through three rolls.

(6) The substrate after the completion of the item (4) is washed with water, dried, acidically degreased and further soft-etched. Then, the substrate is immersed in a catalyst solution of palladium chloride and organic acid to give a Pd catalyst and activated and plated in an electroless plating bath having the following composition to form an uneven layer (roughened layer) of Cu—Ni—P alloy having a thickness of 2.5 µm on the surfaces of copper conductor and viahole pad. Further, the substrate is washed with water and immersed in an electroless tin plating bath of tin borofluoride-thiourea at 50° C. for 1 hour to form a tin-substituted plated layer having a thickness of 0.3 µm on the surface of the roughened layer.

(7) The photosensitive adhesive solution obtained in the item (5) is applied onto both surfaces of the substrate treated in the item (6) by means of a roll coater and lest to stand at a horizontal state for 20 minutes and dried at 60° C. for 30 minutes to form an adhesive layer 2 having a thickness of 60 µm.

In addition to the structure that the photosensitive adhesive layer is directly formed on the resin filler layer, there can be adopted a structure that the insulating layer is formed on the resin filler layer and the photosensitive adhesive layer is formed on the insulating layer. That is, there can be formed the interlaminar insulating layer comprised of the insulating layer and the adhesive layer. In this case, the insulating layer is obtained by mixing 70% by weight of a 25% acrylated product of cresol novolac epoxy resin (made by Nippon Kayaku Co., Ltd.), 25% by weight of polyether sulphone (made by Mitsui Toatsu Co., Ltd.), 4% by weight of benzophenone, 0.4% by weight of Michlar ketone, and an imidazole curing agent, adding normalmethyl pyrolidone (NMP) to adjust the viscosity to 30 Pa·s in a homodisper agitating machine and kneading through three rolls.

(8) A photomask film printed with black circles of 100 $\mu$m$\phi$ is adhered onto both surfaces of the substrate provided with the adhesive layer in the item (7) and exposed to a superhigh pressure mercury lamp at 500 mJ/cm$^2$. It is developed by spraying DMDG solution to form openings for viaholes of 100 $\mu$m$\phi$ in the adhesive layer. Further, the substrate is exposed to a superhigh pressure mercury lamp at 3000 mJ/cm$^2$ and then heated at 100° C. for 1 hour and at 150° C. for 5 hours to form an interlaminar insulating layer (adhesive layer) of 50 $\mu$m in thickness having the openings (openings for the formation of viaholes) with an excellent size accuracy corresponding to the photomask film. Moreover, the tin plated layer is partially exposed in the opening for the viahole.

(9) The substrate treated in the item (8) is immersed in chromic acid for 1 minute to dissolve and remove epoxy resin particles from the surface of the interlaminar insulating layer, whereby the surface of the interlaminar insulating layer is roughened. Thereafter, it is immersed in a neutral solution (made by Shipley) and washed with water. Further, a palladium catalyst (made by Atotec Co., Ltd.) is applied to the roughened surface of the substrate to give a catalyst nucleus to the surface of the interlaminar insulating layer and the inner wall face of the opening for the viahole.

(10) A liquid resist is obtained by mixing a photosensitized oligomer (molecular weight: 4000) in which 25% of epoxy group in cresol novolac type epoxy resin (made by Nippon Kayaku Co., Ltd. trade name: EOCN-103S) dissolved in DMDG is acrylated, an imidazole curing agent (made by Shikoku Kasei Co., Ltd. trade name: 2PMHZ-PW), an acrylic isocyanate (made by Toa Gosei Co., Ltd. trade name: Aronix M215) as a photosensitive monomer, benzophenone (made by Kanto Kagaku Co., Ltd.) as a photoinitiator, and Michlar ketone (made by Kanto Kagaku Co., Ltd.) with NMP according to the following composition, adjusting the viscosity to 3000 cps in a homodisper agitating machine and then kneading through three rolls.

Resin composition: photosensitive epoxy/M215/BP/MK/imidazole=100/10/5/0.5/5

(11) The liquid resist is applied onto both surfaces of the substrate treated in the item (9) by means of a roll coater and dried at 60° C. for 30 minutes to form a resist layer having a thickness of 30 $\mu$m. Then, a mask film pictured with a conductor circuit pattern of L/S (ratio of line to space)=50/50 is adhered and exposed to a superhigh pressure mercury lamp at 1000 mJ/cm$^2$ and developed by spraying DMDG to form a plating resist removing the conductor circuit pattern on the substrate, which is further exposed to a superhigh pressure mercury lamp at 1000 mJ/cm$^2$ and heated at 100° C. for 1 hour and at 150° C. for 3 hours to form a permanent resist on the interlaminar insulating layer.

(12) The substrate provided with the permanent resist is immersed in an aqueous solution of 100 g/l of sulfuric acid to activate the catalyst nucleus and thereafter a primary plating is carried out by using an electroless copper-nickel alloy plating bath having the following composition to form a copper-nickel-phosphorus plated thin film of about 1.7 $\mu$m in thickness on the resist non-formed portion. In this case, the temperature of the plating bath is 60° C. and the plating immersion time is 1 hour.

Metal salts . . . CuSO$_4$·5H$_2$O: 6.0 mM (1.5 g/l) . . . NiSO$_4$·6H$_2$O: 95.1 mM (25 g/l)

Complexing agent . . . Na$_3$C$_6$H$_5$O$_7$: 0.23 M (60 g/l)

Reducing agent . . . NaPH$_2$O$_2$·H$_2$O: 0.19 M (20 g/l)

pH adjusting agent . . . NaOH: 0.75 M (pH=9.5)

Stabilizer . . . lead nitrate: 0.2 mM (80 ppm)

Surfactant: 0.05 g/l

Precipitation rate: 1.7 $\mu$m/hr

(13) The substrate subjected to the primary plating in the item (12) is taken out from the plating bath and washed with water to remove the plating solution adhered to the surface thereof and further treated with an acidic solution to remove oxide film from the surface of the copper-nickel-phosphorus plated thin film layer. Thereafter, the copper-nickel-phosphorus plated thin film is subjected to a secondary plating using an electroless copper plating bath having the following composition without Pd substitution to form overlayer conductor pattern and viahole (BVH) required as a conductor layer through additive process. In this case, the temperature of the plating bath is 50–70° C. and the plating immersion time is 90–360 minutes.

Metal salt . . . CUSO$_4$·5H$_2$O: 8.6 mM

Complexing agent . . . TEA: 0.15 M

Reducing agent . . . HCHO: 0.02 M

Others . . . stabilizer (bipyridyl, potassium ferrocyanide): small

Precipitation rate: 6 $\mu$m/hr

(14) After the conductor layer is formed through the additive process, the one-side surface of the substrate is polished by the belt sander polishing using the #600 belt polishing paper likewise the step of the item (4) so as to align the surface layer of the permanent resist with the uppermost surface of the copper in the viahole. Subsequently, the buff polishing is carried out for removing the scratches created by the belt sander (only the buff polishing may be conducted). Further, the other surface is polished as mentioned above to form a printed wiring substrate having both smooth surfaces.

(15) The aforementioned steps are repeated to form a further one conductor layer through the additive process, whereby there is produced a multilayer printed circuit board having 6 built-up wiring layers.

EXAMPLE 13

(Bisphenol F-type)

(1) A resin filler having a viscosity of 35,000 cps at 23±1° C. is obtained by mixing 100 parts by weight of bisphenol F-type epoxy monomer and 6 parts by weight of an imidazole curing agent (made by Shikoku Kasei Co., Ltd. trade name: 2E4MZ-CN) and kneading through three rolls. This resin filler is a non-solvent resin filler.

(2) A printed circuit board is produced in the same manner as in Example 12.

EXAMPLE 14

A multilayer printed circuit board is produced in the same manner as in Example 12 except that the roughened layer having a thickness of 1.5–3.0 $\mu$m is formed on the inner wall of the through-hole by using an oxidizing bath (NaOH 10 g/l, NaCLO$_2$ 40 g/l, Na$_3$PO$_4$ 6 g/l) and a reducing bath (NaOH 10 g/l, NaBH$_4$).

COMPARATIVE EXAMPLE 4
(Bisphenol A-type+solvent)
(1) A resin filler having a viscosity of 50,000 cps at 23±1° C. is obtained by mixing 100 parts by weight of bisphenol A-type epoxy monomer (made by Yuka Shell Co., Ltd.) and 6 parts by weight of an imidazole curing agent (made by Shikoku Kasei Co., Ltd. trade name: 2E4MZ-CN) and adding 170 parts by weight of $SiO_2$ spherical particles having an average particle size of 1.6 μm (the maximum size of the particle is not more than 15 μm of the thickness of the following innerlayer copper pattern) together with NMP and kneading through three rolls.
(2) A printed circuit board is produced in the same manner as in Example 12.

COMPARATIVE EXAMPLE 5
(Phenol novolac+solvent)
(1) A resin filler having a viscosity of 50,000 cps at 23±1° C. is obtained by mixing 100 parts by weight of phenol novolac type epoxy resin oligomer and 6 parts by weight of an imidazole curing agent (made by Shikoku Kasei Co., Ltd. trade name: 2E4MZ-CN) and adding 170 parts by weight of $SiO_2$ spherical particles having an average particle size of 1.6 μm (the maximum size of the particle is not more than 15 μm of the thickness of the following innerlayer copper pattern) together with NMP and kneading through three rolls.
(2) A printed circuit board is produced in the same manner as in Example 12.

COMPARATIVE EXAMPLE 6
(Phenol novolac+solvent+no inorganic particle)
(1) A resin filler having a viscosity of 50,000 cps at 23±1° C. is obtained by mixing 100 parts by weight of phenol novolac type epoxy resin oligomer and 6 parts by weight of an imidazole curing agent (made by Shikoku Kasei Co., Ltd. trade name: 2E4MZ-CN) with NMP and kneading through three rolls.
(2) A printed circuit board is produced in the same manner as in Example 12.

In the above Examples 12, 13 and Comparative Examples 4–6, the filling property of the resin filler, polishability of the resin filler, presence or absence of shrinkage through curing of the resin filler and presence or absence of interlaminar peel are measured in the production of the printed circuit board and further the resistance to cool-heat shock and water absorption are measured with respect to the resulting printed circuit boards. The results are shown in Table 5.

In the above Example 14, the cracking is not created until 2000 times in the heat cycle test.

TABLE 5

|  | Example | | Comparative Example | | |
| --- | --- | --- | --- | --- | --- |
|  | 12 | 13 | 4 | 5 | 6 |
| Filling property of resin filler | o | o | o | o | o |
| Polishability of resin filler | o | o | o | X | X |
| Shrinkage through curing of resin filler | none | slight |  | presence |  |
| Interlaminar peel | none | none |  | presence |  |
| Resistance to cool-heat shock | o | X | o | o | X |
| Water absorption | o | X | o | o | X |

[Filling Property of Resin Filler]
It is judged whether or not the resin filler is surely filled between the conductor circuits or in the through-hole by means of a roll coater.

[Polishability of Resin Filler]
In the polishing of the cured resin filler, it is judged whether or not notch or crack is created.

[Shrinkage Through Curing of Resin Filler]
It is judged whether or not the space is existent when the section of the through-hole portion formed in the substrate is observed by means of an optical microscope.

[Presence or Absence of Interlaminar Peel]
The peeled state at he boundary between the resin filler layer and the adhesive layer or the insulating layer is confirmed by observing the section of the substrate by means of an optical microscope.

[Resistance to Cool-Heat Shock]
It is judged by the presence or absence of cracks created in the conductor circuit or the resin filler layer after the heat cycle of −65° C. ↔125° C. is repeated 1000 times.

[Water Absorption]
It is judged by the presence or absence of crack or peel created in the through-hole portion when the wiring board is immersed in a boiling water for 1 hour.

In Example 12, the bisphenol F-type epoxy resin containing no solvent and being relatively soft is used as the resin component of the resin filler, so that the viscosity of the resin filler is low and 45–49 Pa·s at 23±1° C. even if it is mixed with silica particles.

As seen from the results of Table 5,
① the resin filler is excellent in the filling property and the polishing property because the polishing can be conducted without causing the crack or notch,
② the resin filler has no shrinkage due to the evaporation of the solvent and has an action of preventing the shrinkage through silica particles and hence there is no shrinkage in the curing,
③ the resin filler is made from a non-solvent resin, so that there is caused no interlaminar peel due to the evaporation of the solvent,
④ silica particles make the thermal expansion coefficient of the resin filler small, so that the resin filler is excellent in the resistance to heat cycle, and
⑤ the resin filler can prevent the occurrence of cracks and the like due to water absorption because the water absorption of the resin filler itself can be controlled by the presence of the silica particles not absorbing water.

In the resin filler of Example 13, the bisphenol F-type epoxy resin containing no solvent and being relatively soft is used as the resin component of the resin filler and the silica particles are not included therein, so that the viscosity of the resin filler is low and is 35 Pa·s at 23±1° C.

As seen from the results of Table 5,
① the resin filler is excellent in the filling property and the polishing property because the polishing can be conducted without causing the crack or notch,
② the shrinkage of the resin filler in the curing is less because there is no shrinkage due to the evaporation of the solvent. In Example 13, however, the action of preventing the shrinkage through the silica particles can not be expected, so that there may be observed a case that a space is slightly caused in the through-hole by the shrinkage of the resin itself through the curing,
③ the resin filler is made from a non-solvent resin, so that there is caused no interlaminar peel due to the evaporation of the solvent, and ④ the resin filler contains no inorganic particles, so that the resistance to heat cycle and the water absorption are slightly poor as compared with the results of Example 12.

In case of containing no inorganic particles as in Example 13, it is desirable that bisphenol A-type epoxy resin having a viscosity higher than that of the bisphenol F-type epoxy resin is used in view of the filling property.

In Comparative Example 4, the resin filler uses the bisphenol A-type epoxy resin as the resin component and contains silica particles, so that the viscosity is high and hence it is required to add a solvent for ensuring the filling property.

As seen from the results of Table 5,

① the resin filler is excellent in the polishability because the bisphenol A-type epoxy resin is used, ② the resin filler contains the inorganic particles, so that the resistance to heat cycle and water absorption are excellent, but ③ the solvent is evaporated in the curing, so that the shrinkage and the interlaminar peel are caused though the resin filler contains the inorganic particles.

In Comparative Example 5, the resin filler uses novolac type epoxy resin having a rigid skeleton as the resin component and contains silica particles, so that the viscosity is high and hence it is required to add a solvent for ensuring the filling property.

As seen from the results of Table 5,

① the resin filler contains the inorganic particles, so that the resistance to heat cycle and water absorption are excellent, but ② the resin filler contains the novolac type epoxy resin being hard and brittle, so that the notch and cracks are caused by polishing and ③ the solvent is evaporated in the curing, so that the shrinkage and the interlaminar peel are caused though the resin filler contains the inorganic particles.

In Comparative Example 6, the resin filler uses novolac type epoxy resin having a rigid skeleton as the resin component, so that the viscosity is high even if silica particles are not included, and hence it is required to add a solvent for ensuring the filling property.

As seen from the results of Table 5,

① the resin filler contains the novolac type epoxy resin being hard and brittle, so that the notch and cracks are caused by polishing, ② the solvent is evaporated in the curing, so that the shrinkage and the interlaminar peel are caused though the resin filler contains the inorganic particles, and ③ the inorganic particles are not included, so that the resistance to heat cycle and water absorption are poor.

INDUSTRIAL APPLICABILITY

As mentioned above, according to the invention, even when the innermost layer of the conductor circuit is formed by the etching treatment through the subtractive process, there is no unevenness on the surface, and also even if the thickness of the resin insulating layer is thin, the peel strength is not lowered, whereby there can stably be provided the multilayer printed circuit boards having excellent resolution, interlaminar insulation property and resistance to cool-heat shock.

Therefore, the multilayer printed circuit board according to the invention exhibits excellent adaptability in many fields requiring high performance and densification of electronic parts.

The resin filler according to the invention can surely smoothen the surface of the substrate by filling in the concave portion created in the surface of the substrate or in the through-holes formed in the substrate, and has various merits that the resistance to chemicals and water absorption are excellent and the interlaminar peel is not caused and the occurrence of crack and peel due to cool-heat shock is prevented. Further, when the surface of the substrate is smoothened by the resin filler according to the invention, the thickness of the interlaminar insulating layer can be uniformized, so that the unopening and poor shaping for the viahole is not caused.

We claim:

1. A build-up multilayer printed circuit board, comiprising:

a substrate having a surface;

a concave portion formed on the surface of the substrate;

a conductor circuit on the substrate, the conductor circuit having a surface; and a solvent-free resin filler filled in the concave portion so as to form a surface at a same level as the surface of the conductor circuit, the resin filler comprisng bisphenlol type epoxy resin and imidazole curing agent.

2. The build-up multilayer printed circuit board of claim 1, wherein the surface of the substrate and the conductor circuit form the concave portion.

3. The build-up multilayer printed circuit board of claim 1, wherein the resin filler further comprises inorganic particles.

4. The build-up multilayer printed circuit board of claim 1, wherein the bisphenol type epoxy resin comprises bisphenol F-type epoxy resin.

5. The build-up multilayer printed circuit board of claim 1, wherein the resin filler has a viscosity of $0.3 \times 10^5$ to $1.0 \times 10^5$ cps at a temperature of $23 \pm 1°$ C.

6. A build-up multilayer printed circuit board, comprising:

a substrate including a through-hole; and a solvent-free resin filler filled in the through-hole of the substrate, the resin filler comprising bisphenol type epoxy resin and imidazole curing agent.

7. The build-up multilayer printed circuit board of claim 6, wherein the resin filler further comprises inorganic particles.

8. The build-up multilayer printed circuit board of claim 6, wherein the bisphenol type epoxy resin comprises bisphenol F-type epoxy resin.

9. The build-up multilayer printed circuit board of claim 6, wherein the resin filler has a viscosity of $0.3 \times 10^5$ to $1.0 \times 10^5$ cps at a temperature of $23 \pm 1°$ C.

10. A build-up multilayer printed circuit board, comprising:

a substrate having a through-hole and a surface;

a concave portion formed on the surface of the substrate;

a conductor circuit on the surface of the substrate, the conductor circuit having a surface;

a solvenit-free resin filler comprising bisphenol type epoxy resin and imidazole curing agent filled in the concave portion so as to form a surface at a same level as the surface of the conductor circuit; and at least one interlaminar insulating layer having at least one viahole and at least one conductor layer alternately laminated on the surface of the resin filler, the conductor layers being electrically connected to each other through the at least one viahole formed in the at least one interlaminar insulating layer.

11. The builld-up multilayer printed circuit board of claim 10, wherein the surface of the substrate and the conductor circuit form the concave portion.

12. The build-up multilayer printed circuit board of claim 10, wherein the resin filler further comprises ceramic filler.

13. A build-up multilayer printed circuit board, comprising:
- a substrate including a surface, a through-hole, and a conductor circuit;
- at least one interlaminar insulating layer having at least one viahole and at least one conductor layer alternately laminated on the surface of the substrate, the conductor layers being electrically connected to each other through the at least one viahole formed in the at least one interlaminar insulating layer; and
- a solvent-free resin filler comprising, bisphenol type epoxy resin and imidazole curing agent filled in the through-hole of the substrate.

14. The build-up multilayer printed circuit board of claim 13, wherein the resin filler further comprises ceramic filler.

15. A build-up multilayer printed circuit board, comprising:
- a substrate including, a surface and a through-hole, the through-hole including an inner wall having a conductor surface thereon, the conductor surface including a roughened layer;
- at least one interlaminar insulating layer having at least one viahole and at least one conductor layer alternately laminated on the surface of the substrate, the conductor layers being electrically connected to each other through the at least one viahole formed in the at least one interlaminar insulating layer; and
- a resin filler filled in the through-hole of the substrate.

* * * * *

UNITED STATES PATENT AND TRADEMARK OFFICE
CERTIFICATE OF CORRECTION

PATENT NO. : 6,010,768
DATED : January 4, 2000
INVENTOR(S) : T. YASUE et al.

It is certified that error appears in the above-identified patent and that said Letters Patent is hereby corrected as shown below:

At column 34, line 14 (claim 1, line 1) of the printed patent, "comiprising" should be ---comprising---.

At column 34, line 22 (claim 1, line 9) of the printed patent, "bisphenlol" should be ---bisphenol---.

At column 34, line 58 (claim 10, line 7) of the printed patent, "solvenit" should be ---solvent---.

Signed and Sealed this

Tenth Day of April, 2001

*Attest:*

NICHOLAS P. GODICI

*Attesting Officer*    Acting Director of the United States Patent and Trademark Office